(12) United States Patent
Sederberg

(10) Patent No.: US 7,274,364 B2
(45) Date of Patent: Sep. 25, 2007

(54) SYSTEM AND METHOD FOR DEFINING T-SPLINE AND T-NURCC SURFACES USING LOCAL REFINEMENTS

(75) Inventor: Thomas W. Sederberg, Orem, UT (US)

(73) Assignee: Brigham Young University, Provo, UT (US)

( * ) Notice: Subject to any disclaimer, the term of this patent is extended or adjusted under 35 U.S.C. 154(b) by 0 days.

(21) Appl. No.: 10/811,057

(22) Filed: Mar. 26, 2004

(65) Prior Publication Data

US 2004/0189633 A1 Sep. 30, 2004

Related U.S. Application Data

(60) Provisional application No. 60/458,231, filed on Mar. 26, 2003.

(51) Int. Cl.
*G06T 17/00* (2006.01)
(52) U.S. Cl. .................................................... 345/420
(58) Field of Classification Search ................. 345/420
See application file for complete search history.

(56) References Cited

U.S. PATENT DOCUMENTS

| | | | | |
|---|---|---|---|---|
| 5,602,979 | A | * | 2/1997 | Loop ............................ 345/423 |
| 5,619,625 | A | * | 4/1997 | Konno et al. ................ 345/419 |
| 6,037,949 | A | | 3/2000 | DeRose et al. |
| 6,222,553 | B1 | | 4/2001 | DeRose et al. |
| 6,256,038 | B1 | * | 7/2001 | Krishnamurthy ............ 345/419 |
| 6,271,856 | B1 | * | 8/2001 | Krishnamurthy ............ 345/581 |
| 6,476,804 | B1 | * | 11/2002 | Costabel ...................... 345/419 |

OTHER PUBLICATIONS

Catmull et al. Recursively Generated B-Spline Surfaces on Arbitrary Topological Meshes. Computer-Aided Design 10. 1978. p. 350-355.*
Weller et al. Tensor Product Spline Spaces with Knot Segments. In Mathematical Methods for Curves and Surfaces. Vanderbilt University Press, Nashville. 1995. p. 563-572.*
Sederberg et al. T-splines and T-NURCCs. ACM Transactions on Graphics. vol. 22, Issue 3. Jul. 2003. p. 477-478.*
Sederberg et al. T-spline Simplification and Local Refinement. ACM Transactions on Graphics. vol. 23, Issue 3. Aug. 2004. p. 276-283.*
Adobe Developers Association. Smooth Shading. Oct. 10, 1997.*
Thomas W. Sederberg et al., "Non-Uniform Recursive Subdivision Surfaces". 1998.
Almaz Bakenov, "T-Splines: Tensor Product B-Spline Surfaces with T-Juncions", Department of Computer Science, Brigham Young University, Aug. 2001.
David R. Forsey et al., "Hierarchical B-Spline Refinement", Computer Graphics Laboratory, Department of Computer Science, University of Waterloo, Waterloo, Ontario, Canada N2L 3G1, Computer Graphics, vol. 22, No. 4, Aug. 1988.

* cited by examiner

*Primary Examiner*—Ulka J. Chauhan
*Assistant Examiner*—Peter-Anthony Pappas
(74) *Attorney, Agent, or Firm*—Thorpe North & Western LLP

(57) ABSTRACT

A system and method is provided for defining a bi-cubic spline surface in a computing environment. One operation in the method is creating a control mesh with a substantially rectangular structure. A further operation is inferring from the control mesh the tensor product B-spline basis functions for each control point. The surface can then be computed based on the basis functions and the control mesh.

18 Claims, 25 Drawing Sheets a. NURBS    b. T-spline a. NURBS  b. T-spline a. Bicubic patch

P has polar label
$f(s-d_1, s, s+d_2; t-e_1, t, t+e_2)$ b. Knot coordinates a.   b.

a. $S_1$ b. $S_2$ c. $S_3$ d. $S_n$ a.

b.

c.

d.

e.

f.

a. T-mesh.   b. Bezier domains.

a.    b.

a. Patch 1    b. Patch 2    c. Merge of both patches

SYSTEM AND METHOD FOR DEFINING T-SPLINE AND T-NURCC SURFACES USING LOCAL REFINEMENTS

The patent application claims priority to U.S. Provisional Patent Application No. 60/458,231, entitled "T-splines" and filed on Mar. 26, 2003.

FIELD OF THE INVENTION

The present invention relates generally to defining a modeled surface that is capable of expressing local refinements.

BACKGROUND

Surface modeling is a fundamental task in computer graphics, computer aided design (CAD), computer aided geometric design (CAGD), and computer animation. Surfaces are typically approximated by a mesh of polygons or piecewise polynomial patches. Because of their simplicity, polygonal meshes are a popular way to approximate surfaces and are adequate for many applications. A drawback of polygonal meshes is that they are inherently faceted, and a large number of polygons may be needed to make the facets small enough to satisfy the demands of the application.

In contrast, a popular smooth surface representation is tensor product B-spline surfaces. The control points for a B-spline surface are required to be topologically arranged in a rectangular grid. B-spline surfaces are comprised of several parametric surface patches that can be represented in Bézier form. A significant advantage of B-spline surfaces is that each of the constituent surface patches are automatically $C^{n-1}$ with its neighboring patches, where n is the degree of the basis functions.

The parameter values at which the constituent surface patches begin and end are called knots, and a non-decreasing sequence of knots is called a knot vector. A B-spline surface definition includes two knot vectors, one for each parameter of the parametric equation. In a uniform B-spline surface, the difference between each pair of knots in a given knot vector is constant. A non-uniform B-spline does not have such a constraint. A rational B-spline surface is one for which the control points are assigned weights. Weights provide additional shape control, allow the introduction of sharp creases in the model, and empower the B-spline surface to represent quadric surfaces. A non-uniform rational B-spline surface is referred to by the acronym NURBS surface.

Refinement of a NURBS control grid is accomplished through a procedure called knot insertion whereby one or more new knot values are inserted into a knot vector. Knot insertion does not alter the surface, but it provides more control points with which the designer can manipulate the model. Because NURBS control points must lie topologically in a rectangular grid, knot insertion causes one or more entire rows of control points to be added to the control grid. Cartesian coordinates for those new rows of control points along with some of the neighboring control points can be found such that the refinement operation does not alter the surface. Unfortunately, adding an entire row of control points for each desired new control point simply to satisfy the rectangular grid topology of NURBS surfaces increases the modeling complexity of the surface dramatically.

Surface refinement is a valuable operation that has several uses. First of all, refinement allows a designer to insert additional control points into a surface region where more detail is called for in the model. For example, more control points would be needed using NURBS to model a human ear than to model a cheek. Second, each time a control grid is refined, the control grid itself becomes an increasingly better approximation of the NURBS surface that it defines. Thus, by performing repeated refinements, the control grid can become an arbitrarily accurate representation of the surface, which is suitable for rendering. Third, knot insertion can be used to compute the control points of the Bézier patches that comprise a NURBS. Fourth, sharp features can be added to NURBS surfaces using knot insertion. NURBS surfaces are generally $C^{n-1}$ continuous, where n is the degree of the surface. However, if r identical knots exist in a knot vector, the surface is $C^{n-r}$ at that knot value. Thus, a triple knot in a cubic NURBS surface permits a $C^0$ crease. Uniform B-spline surfaces do not allow arbitrary knot insertion, for as soon as a single knot is inserted, the surface becomes a non-uniform B-spline surface. The only knot insertion possible for a uniform B-spline surface (if it is to remain uniform after the knot insertion) is to simultaneously insert a knot midway between each pair of neighboring knots, a process called knot doubling. Since uniform B-splines cannot support two or more identical knots, uniform B-spline surfaces are always $C_{n-1}$ continuous and it is not possible to impose a $C^0$ crease.

Several algorithms exist for knot insertion. The Oslo algorithm computes so-called discrete B-splines to define the B-spline basis transformation from a refined space of splines to a subspace. Another method of knot insertion is Boehm's algorithm which works directly with the B-spline coefficients. In addition, mathematical insights like the blossoming principle for knot insertion have been developed.

Knot removal, the inverse operation of knot insertion, can also be performed on NURBS. By comparison, knot insertion does not modify the surface, while knot removal in general does alter the surface. Therefore, knot removal usually involves approximation. One motivation for knot removal is data reduction. The problem is to minimize the number of knots subject to an error tolerance. Another application of knot removal is shape fairing. The continuity order can be increased by removing knots.

The requirement that all control points for a NURBS surface must topologically be positioned in a rectangular grid is a serious shortcoming. There are at least three reasons why this is a problem. First, surfaces of arbitrary topology can be represented using NURBS surfaces only by partitioning the model into a collection of individual NURBS patches. Adjacent patches are then explicitly stitched together using geometric continuity conditions. FIG. 2 shows a hand model comprised of seven NURBS surfaces. The small rectangular area is magnified in FIG. 3 to show a hole where neighboring NURBS surfaces do not match exactly. The presence of such gaps places a burden on modelers who potentially must repair a widened gap whenever the model is deformed.

A second reason why this constraint is so serious is because it typically means that a large number of NURBS control points serve no purpose other than to satisfy topological constraints. They carry no significant geometric information. Superfluous control points are a serious nuisance for designers, not merely because they require the designer to deal with more data, but also because they can introduce unwanted ripples in the surface. FIG. 1 shows a NURBS head model. Designers can waste dozens of hours on models, such as FIG. 1, in tweaking the NURBS control points while attempting to remove unwanted ripples. The darker NURBS control points are superfluous (as will be later shown in the present invention) and have been added as the result of including control points desired by the modeler that resulted in additional rows of control points.

A third reason why the rectangular grid constraint is a problem is that it is not possible to insert a single control point into a NURBS control grid, but rather, an entire row of control points must be added each time a single knot insertion is performed. This means that true local refinement of NURBS surfaces is not possible, since the insertion of a single control point demands the insertion of an entire row into the control grid.

In order to further illustrate the complexities of solving the problems associated with NURBS, one attempt at solving this problem will now be addressed. In August 2001, Almaz Bakenov completed a master's thesis at Brigham Young University entitled, "T-splines: Tensor Product B-spline Surfaces with T-Junctions". Thomas W. Sederberg, the inventor of the present invention described later in the detailed description, was the advisor for Almaz Bakenov's thesis. The Bakenov thesis represents an early attempt at resolving the problems associated with NURBS. Indeed, Thomas W. Sederberg wrestled with this problem from 1999 to 2003. Thus, we have the slightly confusing situation in which there are two significantly different concepts called T-splines: the concept later described in the present invention, and the notion of T-splines described in the Bakenov thesis.

Particularly, the notion of T-splines presented in the Bakenov thesis contains limitations that render it almost useless. Most significantly, the T-splines described in the Bakenov thesis are not capable of solving the problems associated with NURBS without the solution of a potentially huge system of linear equations, for which a solution does not exist in many cases. For these reasons, the notion of T-splines contained in the Bakenov thesis is of little practical value.

Several surface formulations have been proposed that do not suffer from NURBS' topological constraint of requiring all control points to lie in a rectangular grid. The arbitrary-topology surface formulation that is most pertinent to the present discussion is called a subdivision surface. Catmull-Clark subdivision surfaces are, in fact, generalizations of B-spline surfaces. When the control points of a Catmull-Clark surface happen to lie topologically in a rectangular grid, the surface degenerates to a bicubic uniform B-spline surface. In like manner, Doo-Sabin subdivision surfaces generalize biquadratic uniform B-spline surfaces to control grids of arbitrary topology.

Refinement of a Catmull-Clark surface is based on the notion of knot doubling for uniform bicubic B-spline surfaces, with special rules introduced to handle non-four-sided faces and non-valence-four vertices. With each refinement step, the number of faces grows by a factor of four. Repeated refinement causes the control grid to approximate the limit surface ever more closely.

A problem with Catmull-Clark surfaces is that, since they are based on uniform B-spline surfaces, it is not possible to represent sharp $C^0$ features. However, some methods have been proposed for defining sharp features, edges, creases, and corners into subdivision surfaces by altering the refinement rules in the neighborhood of such features.

Another more serious problem is that local refinement of Catmull-Clark surfaces is not possible. In fact, where the simplest refinement operation for a NURBS surface is to insert a single row of control points, only a global refinement operation is defined for Catmull-Clark surfaces, and the number of control points grows by roughly a factor of four with each refinement step.

SUMMARY OF THE INVENTION

A system and method is provided for creating a bi-cubic spline surface in a computing environment. One operation in the method is defining a control mesh with a substantially rectangular structure. A further operation is inferring from the control mesh the tensor product B-spline basis functions for each control point. The surface can then be computed based on the basis functions and the control mesh.

Additional features and advantages of the invention will be apparent from the detailed description which follows, taken in conjunction with the accompanying drawings, which together illustrate, by way of example, features of the invention.

DETAILED DESCRIPTION

Figure 1:
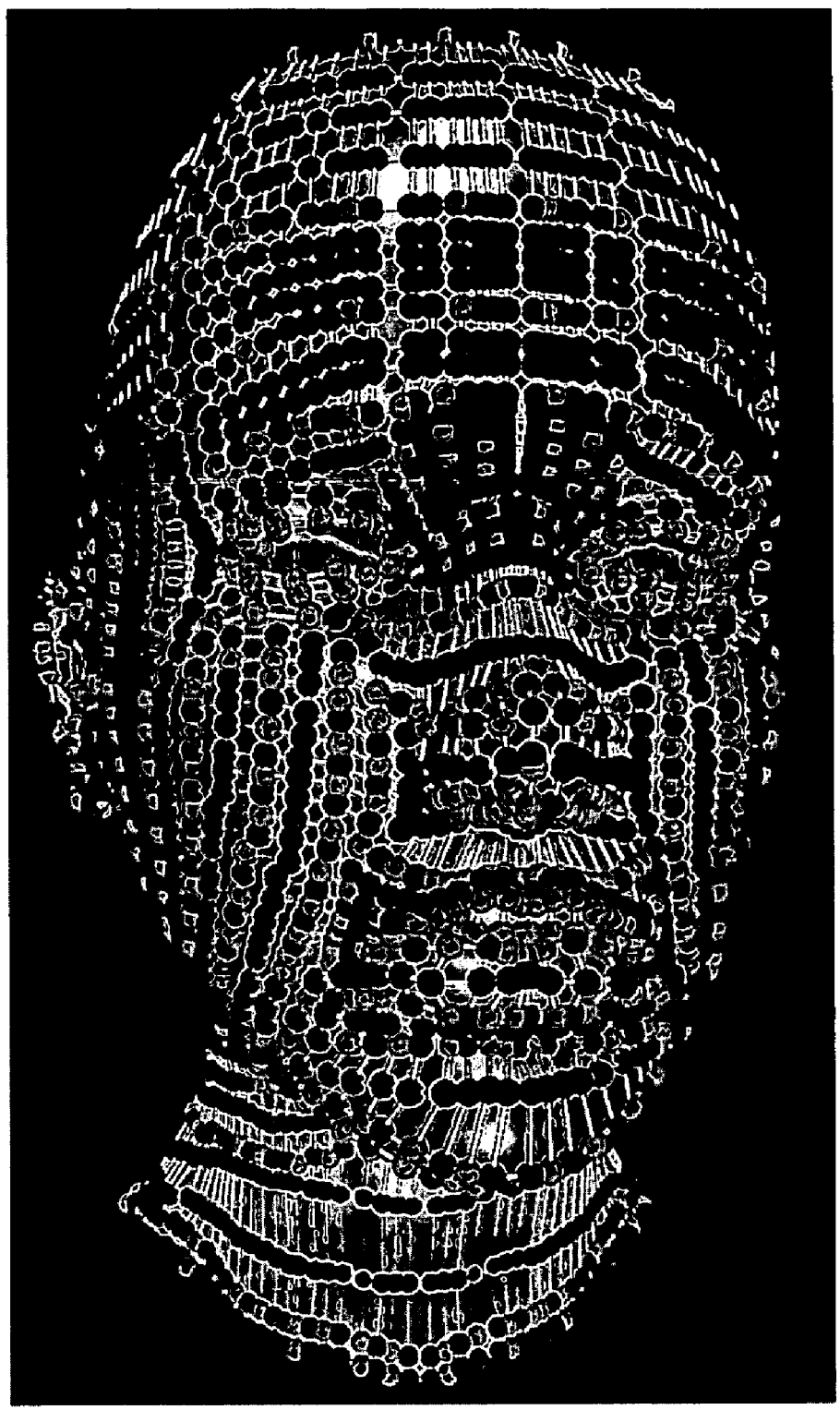
FIG. 1 is a perspective view of a NURBS model of a human head.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

The present system and method of the invention provide a generalization and improvement of non-uniform B-spline surfaces (NURBS) called T-splines. A major problem with NURBS surfaces is that, because NURBS control points must lie topologically in a rectangular grid, it is often the case that a large percentage of the NURBS control points serve no purpose other than to satisfy the rectangular grid topology. We refer to such control points as superfluous, because they contain no significant geometric information. T-splines are a generalization of NURBS surfaces that are capable of minimizing the number of superfluous control points. In addition, T-splines can insert a control point into the control mesh such that a bi-cubic spline surface is not geometrically altered.

Figure 5:
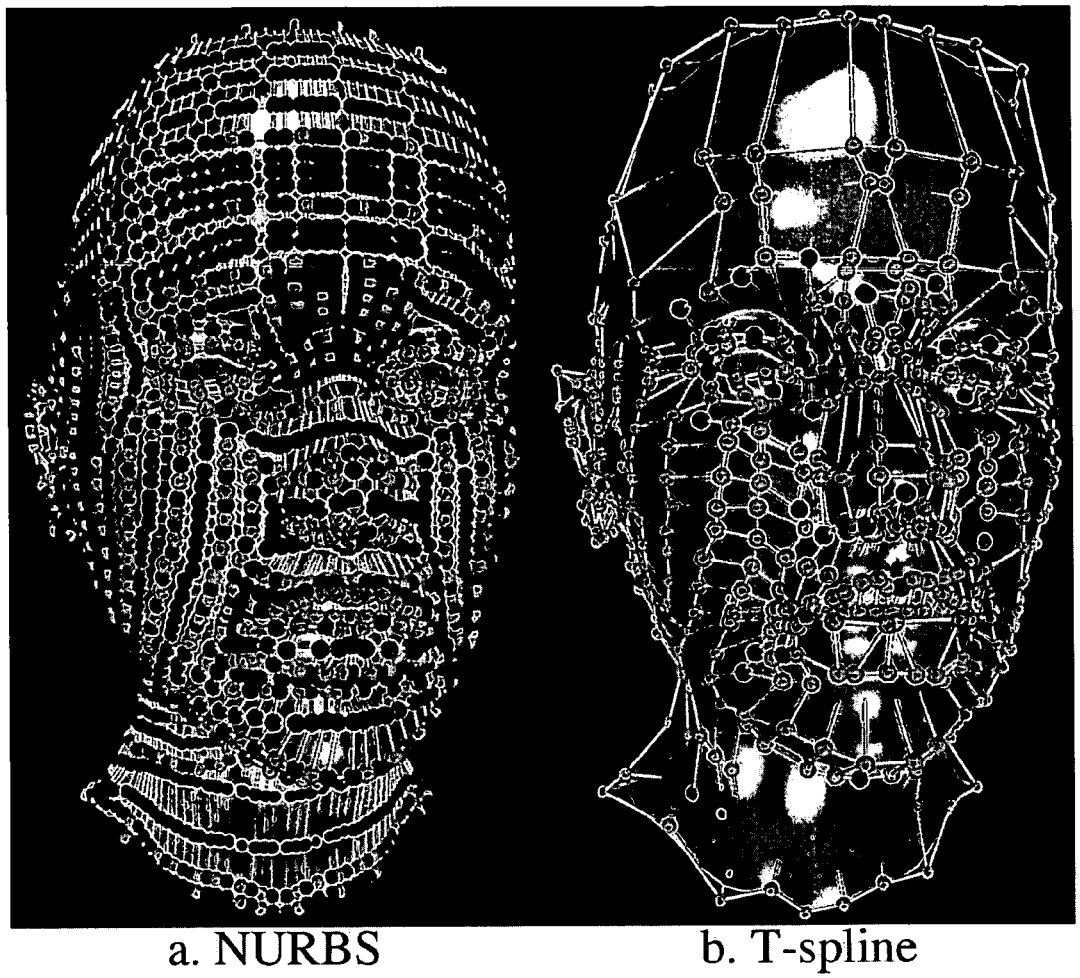
FIG. 5 illustrates a head modeled as a NURBS surface and a head modeled as a T-spline surface in an embodiment of the invention.

One difference between a T-mesh (or a T-spline control mesh) and a NURBS control mesh is that T-splines allow a row of control points to terminate. Accordingly, a row can include many points or just a single point. The final control point in a partial row is called a T-junction. The T-junctions can be seen in FIGS. 13b and c as compared to the rectangular grid in FIGS. 13a and d. FIG. 5b shows another example of a T-spline in which the superfluous control points in a NURBS head model of FIG. 5a are removed or avoided when using a T-spline. A T-spline surface model is geometrically equivalent to a NURBS model, yet a T-spline representation can often be made using substantially fewer control points than an equivalent NURBS model.

T-spline control grids permit T-junctions, so lines of control points need not traverse the entire control grid as with a NURBS. In other words, T-junctions allow T-splines to be locally refineable and control points can be inserted into the control grid without propagating an entire row or column of control points.

T-splines support many valuable operations within a consistent framework, such as local refinement, and the merging of several B-spline surfaces that have different knot vectors into a single gap-free model. This detailed description focuses on T-splines of degree three, which are $C^2$ in the absence of multiple knots. However, the use of T-splines extends to any degree. T-NURCCs (Non-Uniform Rational Catmull-Clark Surfaces with T-junctions) are a superset of both T-splines and Catmull-Clark surfaces. Thus, T-NURCCs will also be discussed in this disclosure. In addition, a modeling program for T-NURCCs can handle any NURBS or Catmull-Clark model as special cases.

T-NURCCs enable true local refinement of a Catmull-Clark-type control grid. This means individual control points can be inserted only where they are needed to provide additional control, or to create a smoother tessellation, and such insertions do not alter the geometry of the surface or the limit surface. T-NURCCs use stationary refinement rules and are $C^2$ except at extraordinary points and features. The detailed description also presents a locally refineable subdivision surface called T-NURCCs (Non-Uniform Rational Catmull-Clark surfaces with T-junctions). In T-NURCCs, faces adjacent to an extraordinary point can be refined without propagating the refinement, and faces in highly curved regions can also be refined locally. As in T-splines, individual control points can also be inserted into a T-NURCC to provide finer control over details. T-NURCCs are a generalization of both Catmull-Clark surfaces and NURBS.

Figure 6:
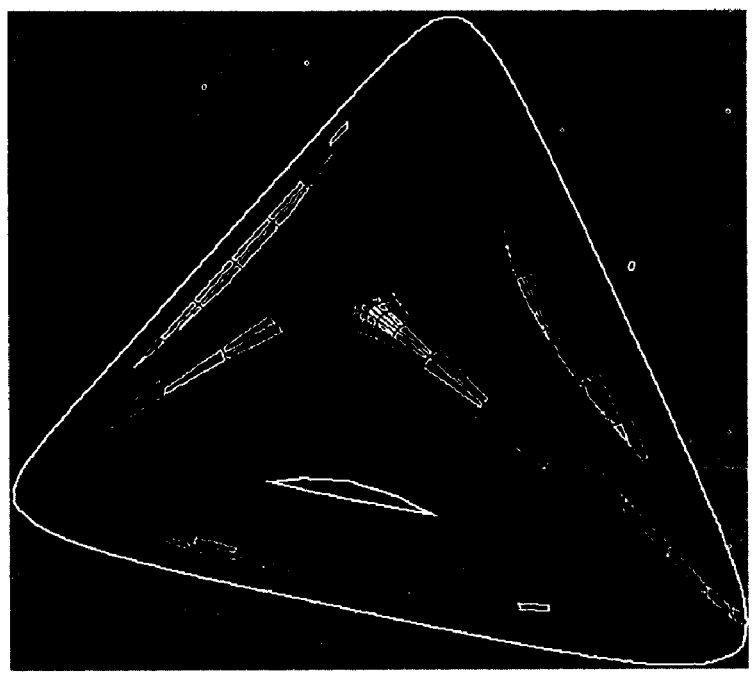
FIG. 6 illustrates an embodiment of a Catmull-Clark mesh that is refined using T-NURCC local refinements.
Figure 6:
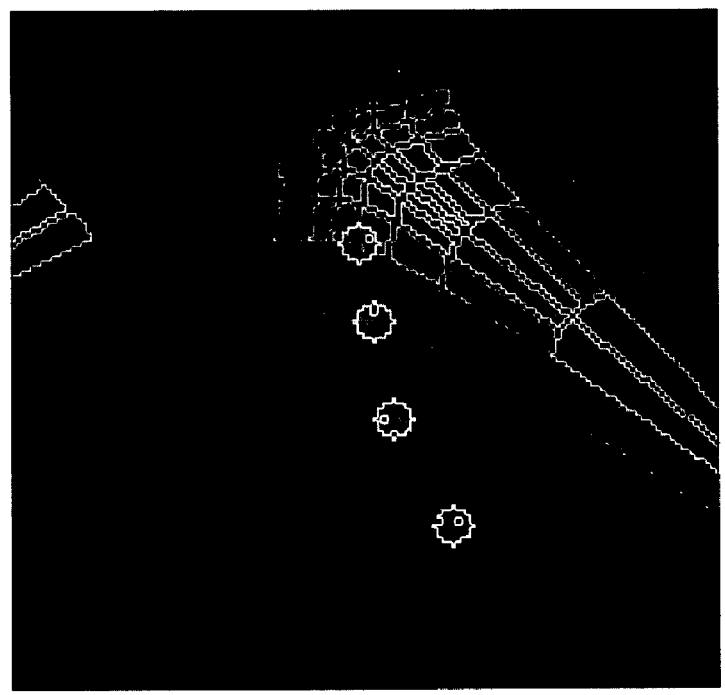

FIG. 6 shows how a T-NURCC local refinement enables a T-NURCC tessellation to be far more economical than a globally-refined Catmull-Clark surface. The T-NURCC version of the tetrahedral shape in FIG. 6 has 2496 faces. A globally refined Catmull-Clark surface for the tetrahedral shape needs 393,216 faces to achieve the same precision.

Figure 2:
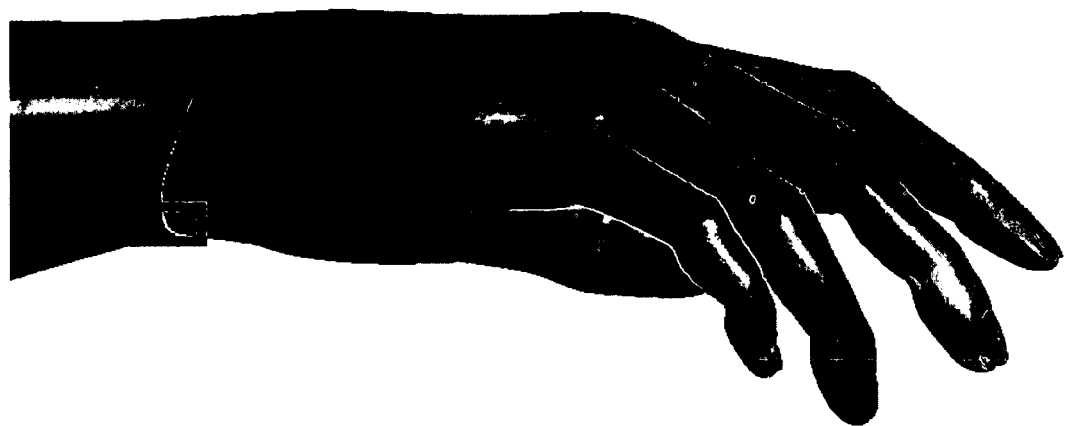
FIG. 2 illustrates a NURBS model of a human hand.
Figure 3:
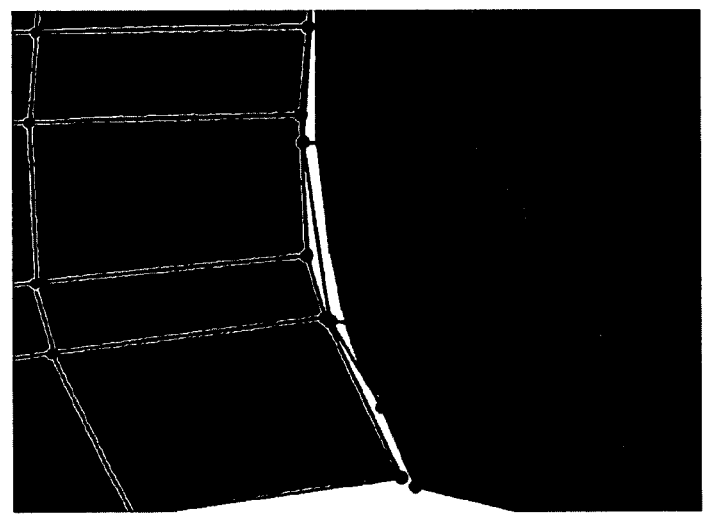
FIG. 3 depicts a hole where neighboring surfaces do not exactly match in the NURBS model of the hand in FIG. 2.
Figure 4:
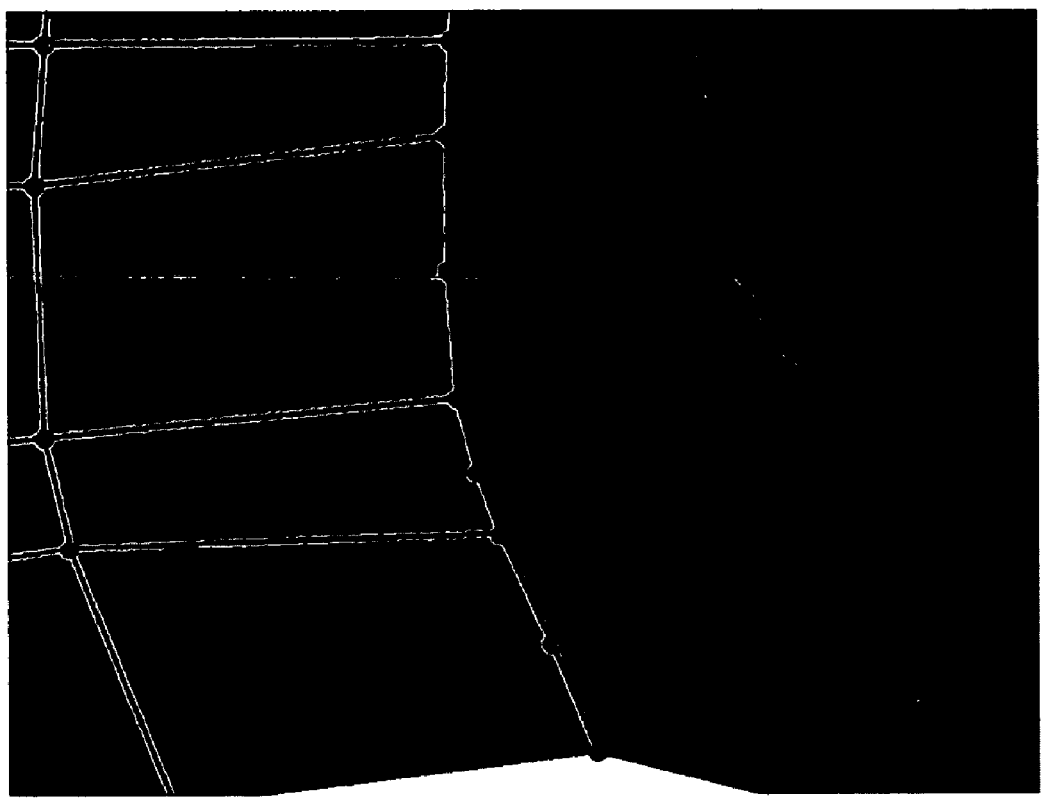
FIG. 4 depicts the two surfaces in the NURBS model human hand of FIG. 2 that have been corrected using a T-spline using an embodiment of the present invention.

Returning again to FIG. 2, the figure shows a hand model comprised of seven B-spline surfaces. The small rectangular area is blown up in FIG. 3 to magnify a hole where neighboring B-spline surfaces do not match exactly. The presence of such gaps places a, burden on modelers, who may need to repair a widened gap whenever the model is deformed. FIG. 3 shows the gap created using NURBS and FIG. 4 shows the model after being converted into a gap-free T-spline, thereby eliminating the need for repair. T-splines and T-NURCCs can thus imbue models comprised of several NURBS surfaces with the same air-tightness that Catmull-Clark surfaces extend to uniform cubic B-spline based models. T-splines are an enhancement of NURBS surfaces that allow the presence of T-junction control points.

Figure 7:
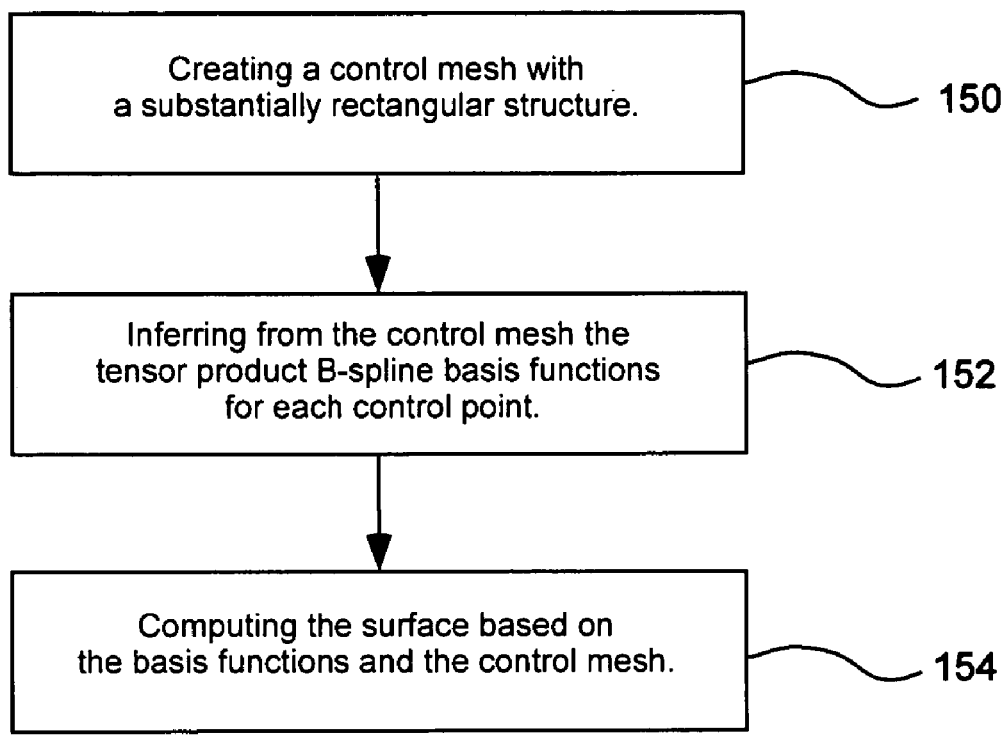
FIG. 7 is a flow chart illustrating an embodiment of a method for defining a bi-cubic spline surface in a computing environment.

FIG. 7 illustrates the fundamental nature of the present invention and provides an overview thereof. A method is provided for defining a bi-cubic spline surface in a computing environment. One operation in the method is creating a control mesh with a substantially rectangular structure as in block 150. Another operation is inferring from the control mesh the tensor product B-spline basis functions for each control point as in block 152. A further operation is computing the surface based on the basis functions and the control mesh as in block 154. The basis function can also be determined for each control point using one non-hierarchical set of rules.

Refinement of a control mesh is the process of adding control points to the control mesh without altering the surface defined by the control mesh. As discussed, the simplest form of refinement for NURBS surfaces requires the addition of an entire row of control points to the control grid. In contrast, the present invention enables a modeler to refine a T-spline control grid with a single control point. In simple terms, the surface as it existed before the addition of the control point is unaltered. Prior known surfaces such as NURBS do not support the addition of a single new control point. This problem will be illustrated in further detail later. The present invention has been discussed in general terms up to this point but a more technical description of the invention will now follow.

Knot Intervals

Figure 8:
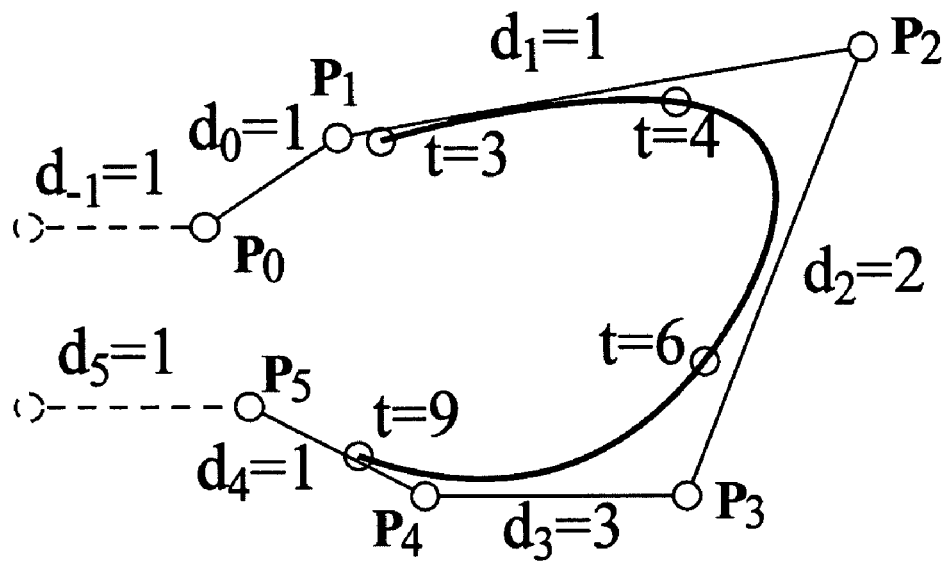
FIG. 8 depicts an example of a cubic B-spline curve with a knot vector.

A knot interval is a non-negative number assigned to each edge of a T-spline control grid for the purpose of conveying knot information. In the cubic B-spline curve shown in FIG. 8, the $d_i$ values that label each edge of the control polygon are knot intervals. Each knot interval is the difference between two consecutive knots in the knot vector. For a non-periodic curve, end-condition knot intervals are assigned to "phantom" edges adjacent to each end of the control polygon (in this case $d_{-1}$ and $d_5$). For all but the first and last edges of the control polygon, the knot interval of each edge is the parameter length of the curve segment to which the edge maps. Any constant can be added to the knots in a knot vector without changing the knot intervals for the curve. Thus, if the knot intervals are given and a knot vector is desired to be inferred, then a knot origin can be chosen.

Figure 9:
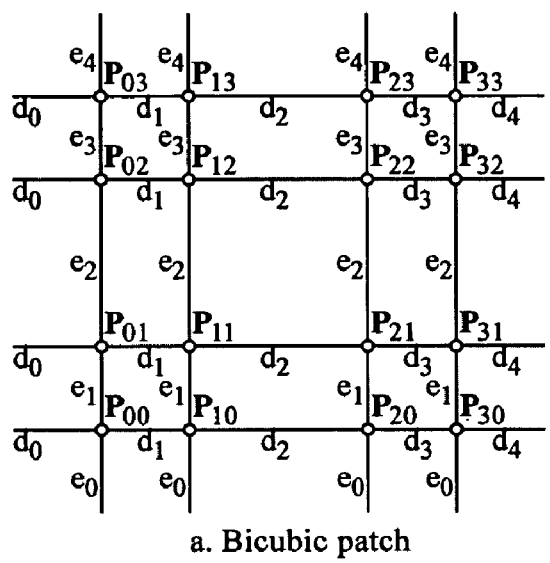
FIGS. 9a and 9b illustrate a region of a NURBS control mesh labeled with knot intervals.
Figure 9:
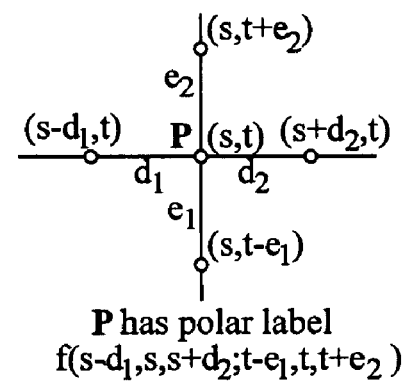

Edges of T-spline and T-NURCC control grids are likewise labeled with knot intervals. Since T-NURCC control meshes are not rectangular grids, knot intervals enable local knot coordinate systems to be imposed on the surface. FIG. 9 shows a regular subgrid of a NURCC control grid. We can impose a local knot coordinate system on this region, and therewith determine basis functions for the control points, as follows. First, (arbitrarily) assign $P_{00}$ the local knot coordinates of $(d_0, e_0)$. The local knot vectors for this regular subgrid are then $\{d\}=\{0,\bar{d}_0,\bar{d}_1,\ldots\}$ and $\{e\}=\{0, \bar{e}_0, e_1, \ldots\}$ where $$\bar{d}_i = \sum_{j=0}^{i} d_j;\ \bar{e}_i = \sum_{j=0}^{i} e_j$$

and $\bar{d}_{-1}=\bar{e}_{-1}=0$. The polar label for control point $P_{ij}$, with respect to this local coordinate system, is thus $f(\bar{d}_{i-1},\bar{d}_i,\bar{d}_{i+1}; \bar{e}_{j-1},\bar{e}_j,\bar{e}_{j+1})$ and the surface defined by the regular subgrid is $$P(s,t) = \sum_i \sum_j P_{ij} N_i^3(s) N_j^3(t)$$

where $N_i^3(s)$ are the cubic B-spline basis functions over $\{d\}$ and the $N_j^3(t)$ are over $\{e\}$. The superscript 3 denotes degree, not order.

T-Splines

A control grid for a T-spline surface is called a T-mesh. If a T-mesh forms a rectangular grid, the T-spline degenerates to a B-spline surface. A T-mesh is basically a rectangular grid that allows T-junctions. The pre-image of each edge in a T-mesh is a line segment of constant s (which we will call an s-edge) or of constant t (which we will call a t-edge). A T-junction is a vertex shared by one s-edge and two t-edges, or by one t-edge and two s-edges.

Figure 10:
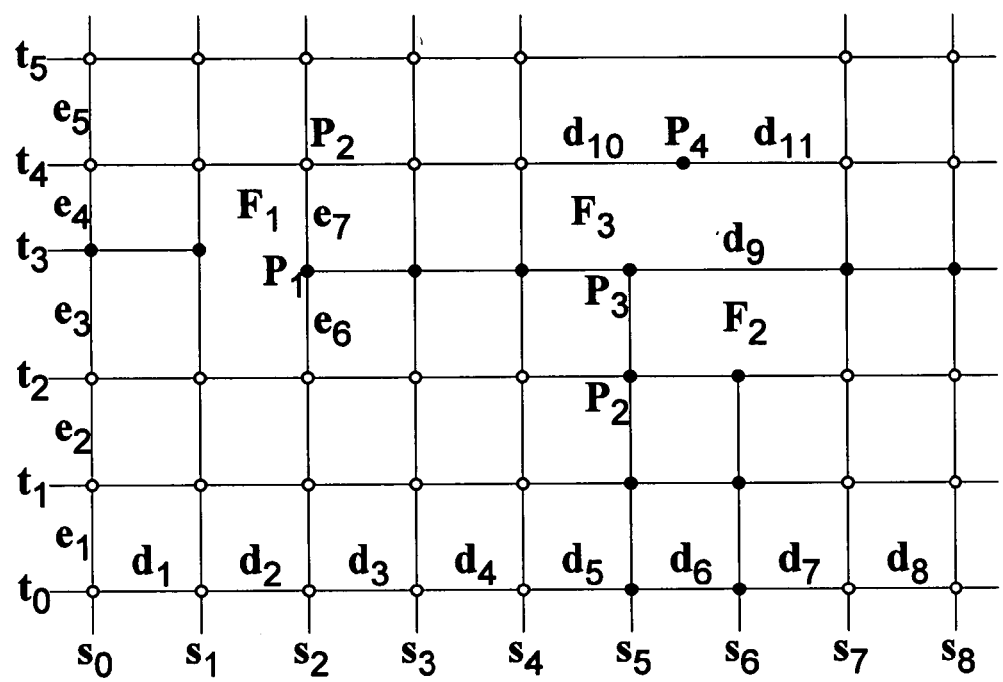
FIG. 10 shows an embodiment of a pre-image of a portion of a T-mesh in (s,t) parameter space.

A knot interval is assigned to each edge in the T-mesh. FIG. 10 shows the pre-image of a portion of a T-mesh in (s,t) parameter space, where the $d_i$ and $e_i$ denote the knot intervals. Knot intervals are constrained by the relationship that the sum of all knot intervals along one side of any face must equal the sum of the knot intervals on the opposing side. For example, in FIG. 10 on face $F_1$, $e_3+e_4=e_6+e_7$, and on face $F_2$, $d_6+d_7=d_9$.

The inventor of the present invention has realized that it is possible to infer a local knot coordinate system from the knot intervals on a T-mesh. To impose a knot coordinate system, a control point can be first chosen whose pre-image will serve as the origin for the parameter domain $(s,t)=(0,0)$. For the example in FIG. 10, $(s_0,t_0)$ can be designated to be the knot origin.

Once a knot origin is chosen, an s knot value can be assigned to each vertical edge in the T-mesh topology, and a t knot value to each horizontal edge in the T-mesh topology. In FIG. 10, those knot values are labeled $s_i$ and $t_i$. Based on the choice of knot origin, we have $s_0=t_0=0$, $s_1=d_1$, $S_2=d_1+d_2$, $S_3=d_1+d_2+d_3$, $t_1=e_1$, $t_2=e_1+e_2$, and so forth. Likewise, each control point has knot coordinates. For example, the knot coordinates for $P_1$ are $(s_2, t_2+e_6)$, for $P_2$ are $(s_5,t_2)$, and for $P_3$ are $(S_5,t_2+e_6)$.

One additional rule for T-meshes is that if a T-junction on one edge of a face can legally be connected to a T-junction on an opposing edge of the face (thereby splitting the face into two faces), that edge must be included in the T-mesh. Legal means that the sum of knot vectors on opposing sides of each face must always be equal. Thus, a horizontal line would need to split face $F_1$ if and only if $e_3=e_6$ and therefore also $e_4=e_7$.

The knot coordinate system is used in writing an explicit formula for a T-spline surface:

$$P(s,t) = (x(s,t), y(s,t), z(s,t), w(s,t)) = \sum_{i=1}^{n} P_i B_i(s,t) \quad (1)$$

where $P_i=(x_i,y_i,z_i,w_i)$ are control points in $p^4$ whose weights are $w_i$, and whose Cartesian coordinates are $(x_i/w_i,y_i/w_i,z_i/w_i)$. Likewise, the Cartesian coordinates of points on the surface are given by $$\frac{\sum_{i=1}^{n}(x_i, y_i, z_i)B_i(s,t)}{\sum_{i=1}^{n} w_i B_i(s,t)} \quad (2)$$

Figure 11:
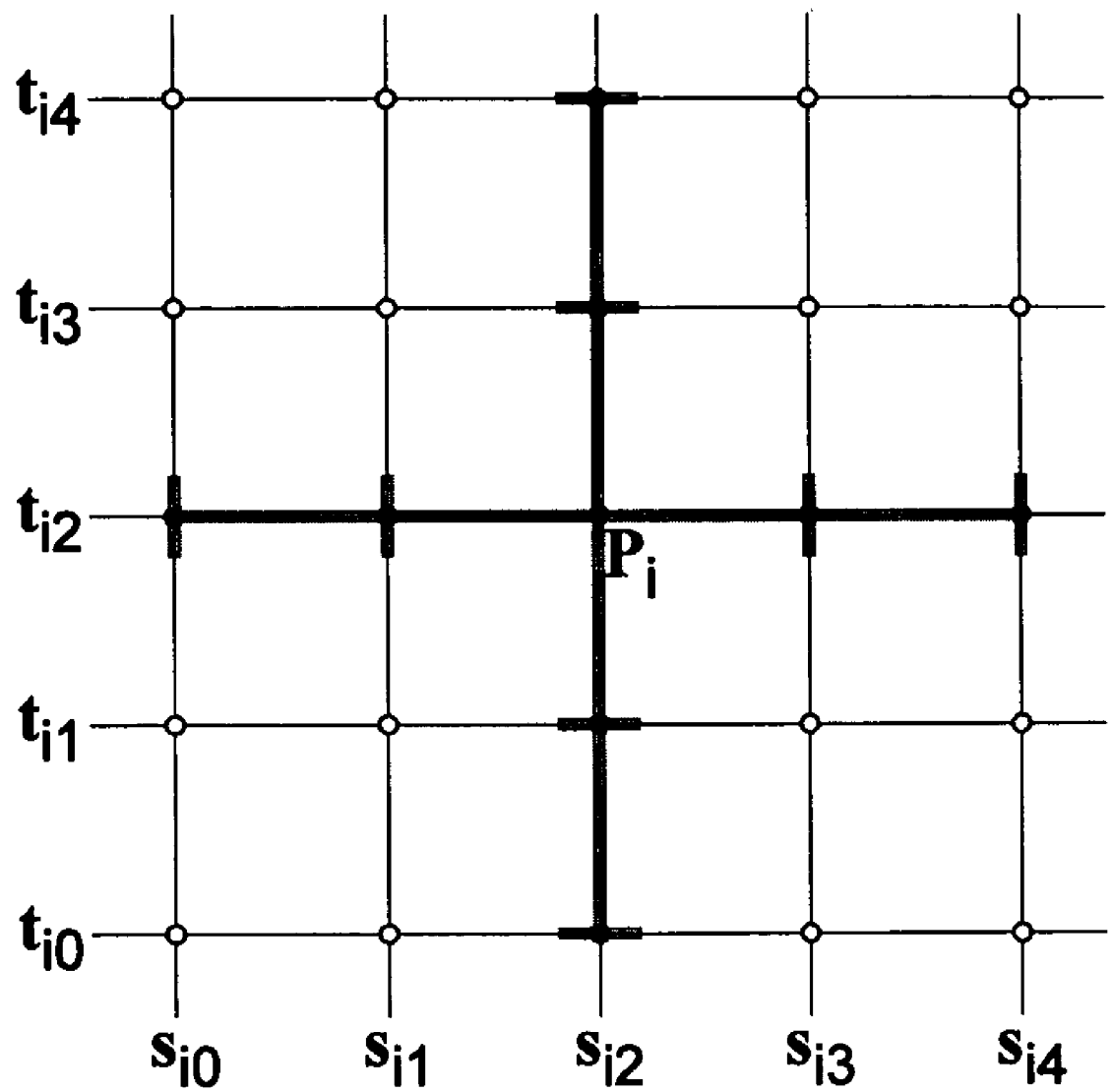
FIG. 11 illustrates knot lines for a basis function $B_i(s,t)$.

The basis functions $B_i(s,t)$ are given by $$B_i(s,t)=N[s_{i0},s_{i1},s_{i2},s_{i3},s_{i4}](s)N[t_{i0},t_{i1},t_{i2},t_{i3},t_{i4}](t)$$

where $N[s_{i0},s_{i1},s_{i2},s_{i3},s_{i4}](s)$ is the cubic B-spline basis function associated with the knot vector $$s_i=[s_{i0},s_{i0},s_{i2},s_{i3},s_{i4}] \quad (3)$$

and $N[t_{i0},t_{i1},t_{i2},t_{i3},t_{i4}](t)$ is associated with the knot vector $$t_i=[t_{i0},t_{i1},t_{i2},t_{i3},t_{i4}] \quad (4)$$

as illustrated in FIG. 11.

The designer is free to adjust the weights $w_i$ to obtain additional shape control, as in rational B-splines. As explained later, weights also play an important role in our new local refinement algorithm: A T-spline whose weights are all one before refinement might end up with some weights not equal to one after refinement, yet $$\sum_{i=1}^{n} w_i B_i(s, t) \equiv 1.$$

The T-spline equation is similar to the equation for a tensor-product rational B-spline surface. One difference between the T-spline equation and a B-spline equation is in how the knot vectors $s_i$ and $t_i$ are determined for each basis function $B_i(s,t)$. Knot vectors $s_i$ and $t_i$ are inferred from the T-mesh neighborhood of $P_i$. Since reference will be made to the rule whereby the knot vectors are inferred, it is formally stated as:

Rule 1. Knot vectors $s_i$ and $t_i$ for the basis function of $P_i$ are determined as follows. $(s_{i2}, t_{i2})$ are the knot coordinates of $P_i$. Consider a ray in parameter space $R(\alpha) = (s_{i2} + \alpha, t_{i2})$. Then $s_{i3}$ and $s_{i4}$ are the s coordinates of the first two s-edges intersected by the ray (not including the initial $(s_{i2}, t_{i2})$. By s-edge, we mean a vertical line segment of constant s in the pre-image of a T-mesh. The other knots in $s_i$ and $t_i$ are found in like manner.

Rule 1 can be illustrated by a few examples. The knot vectors for $P_1$ in FIG. 10 are $s_1 = [s_0, s_1, s_2, s_3, s_4]$ and $t_1 = [t_1, t_2, t_2 + e_6, t_4, t_5]$. For $P_2$, $s_2 = [s_3, s_4, s_5, s_6, s_7]$ and $t_2 = [t_0, t_1, t_2, t_2 + e_6, t_4]$. For $P_3$, $s_3 = [s_3, s_4, s_5, s_7, s_8]$ and $t_3 = [t_1, t_2, t_2 + e_6, t_4, t_5]$. Once these knot vectors are determined for each basis function, the T-spline is defined using the above-mentioned T-spline equations.

T-Spline Local Refinement

An overview of one embodiment of operations of the invention for inserting control points to for a T-spline will now be described. It should also be realized that other embodiments of this invention exist and that the invention can also be implemented in different forms that are computationally equal. The surface and its associated control mesh are typically calculated in Cartesian coordinates. However other coordinate systems can be used such as Polar coordinates, curvilinear coordinates, or one of the many other known coordinate systems. Basis function refinement plays an important role in this algorithm and is reviewed first. Next, the notion of T-spline spaces is introduced. This concept is used in the local refinement algorithm.

Basis Function Refinement

If $s = [s_0, s_1, s_2, s_3, s_4]$ is a knot vector and $\tilde{s}$ is a knot vector with m knots with s a subsequence of $\tilde{s}$, then $N[s_0, s_1, s_2, s_3, s_4](s)$ can be written as a linear combination of the m−4 B-spline basis functions defined over the substrings of length 5 in $\tilde{s}$.

We now present all basis function refinement equations for the knot case m=6. These are the cases for which a single knot is inserted into s to create $\tilde{s}$. Equations for m>6 can be found by repeated application of these equations. If $\tilde{s} = [s_0, k, s_1, s_2, s_3, s_4]$ then $$N(s) = (k-s_0)/(s_3-s_0)N[s_0, k, s_1, s_2, s_3](s) + N[k, s_1, s_2, s_3, s_4](s) \quad (5)$$

If $\tilde{s} = [s_0, s_1, k, s_2, s_3, s_4]$, $$N(s) = (k-s_0)/(s_3-s_0)N[s_0, s_1, k, s_2, s_3](s) + (s_4-k)/(s_4-s_1)N[s_1, k, s_2, s_3, s_4](s) \quad (6)$$

If $\tilde{s} = [s_0, s_1, s_2, k, s_3, s_4]$, $$N(s) = (k-s_0)/(s_3-s_0)N[s_0, s_1, k, s_2, s_3](s) + (s_4-k)/(s_4-s_1)N[s_1, s_2, k, s_3, s_4](s) \quad (7)$$

If $\tilde{s} = [s_0, s_1, s_2, s_3, k, s_4]$, $$N(s) = N[s_0, s_1, s_2, s_3, k](s) + (s_4-k)/(s_4-s_1)N[s_1, s_2, s_3, k, s_4](s) \quad (8)$$

If $k \leq s_0$ or $k \leq s_4$, $N(s)$ does not change.

A T-spline basis function $B(s,t)$ can undergo knot insertion in either s or t, thereby splitting it into two scaled basis functions that sum to the initial function. Further insertion into these resultant scaled basis functions yields a set of scaled basis functions that sum to the original function.

Figure 12:
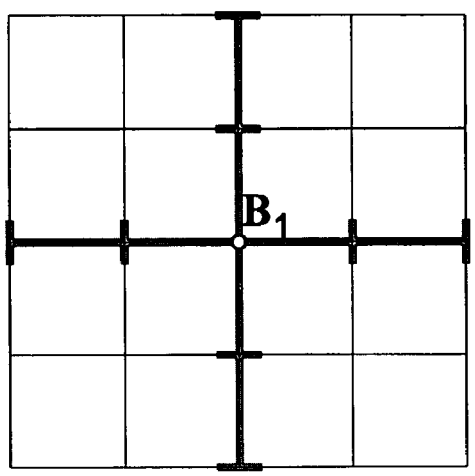
FIG. 12 illustrates a sample refinement of $B_1(s,t)$ in an embodiment of the present invention.
Figure 12:
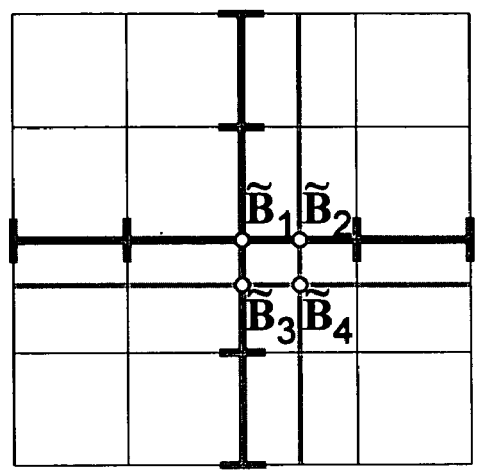

For example, FIG. 12a shows the knot vectors for a T-spline basis function $B_1$, and FIG. 12b shows a refinement of the knot vectors in FIG. 12.a. By appropriate application of (5)-(8), we can obtain $$B_1(s,t) = c_1^{\ 1}\tilde{B}_1(s,t) + c_1^{\ 2}\tilde{B}_2(s,t) + c_1^{\ 3}\tilde{B}_3(s,t) + c_1^{\ 4}\tilde{B}_4(s,t) \quad (9)$$

T-Spline Spaces

A T-spline space can be defined as the set of all T-splines that have the same T-mesh topology, knot intervals, and knot coordinate system. Thus, a T-spline space can be represented by the diagram of a pre-image of a T-mesh such as in FIG. 10. Since all T-splines in a given T-spline space have the same pre-image, it is proper to speak of the pre-image of a T-spline space. A T-spline space $S_1$ can be described as a subspace of $S_2$ (denoted $S_2 \supset S_1$) if local refinement of a T-spline in $S_1$ will produce a T-spline in $S_2$ (discussed later in the section on local refinement). If $T_1$ is a T-spline, then $T_1 \in S_1$ means that $T_1$ has a control grid whose topology and knot intervals are specified by $S_1$.

Figure 13:
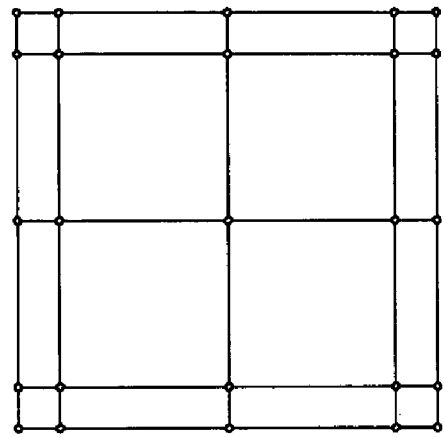
FIG. 13 illustrates an embodiment of a nested sequence of T-spline spaces.
Figure 13:
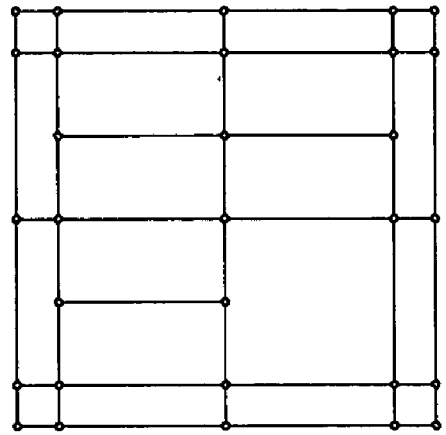
Figure 13:
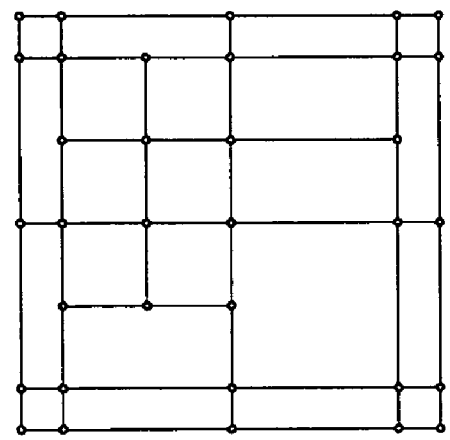
Figure 13:
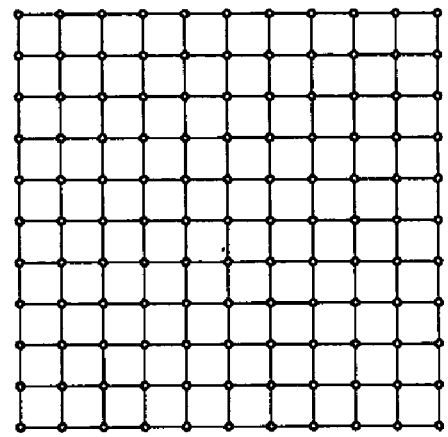

FIG. 13 illustrates a nested sequence of T-spline spaces, that is, $S_1 \subset S_2 \subset S_3 \subset \ldots \subset S_n$. Given a T-spline $P(s,t) \in S_1$, denote by P the column vector of control points for $P(s,t)$. Given a second T-spline $\tilde{P}(s,t) \in S_2$, such that $P(s,t) \equiv \tilde{P}(s,t)$, denote by $\tilde{P}$ the column vector of control points for $\tilde{P}(s,t)$. There exists a unique linear transformation that maps P into $\tilde{P}$. We can denote the linear transformation $$M_{1,2}P = \tilde{P}. \quad (10)$$

The matrix $M_{1,2}$ is found as follows. $P(s,t)$ is given by (1), and $$\tilde{P}(s,t) = \sum_{i=1}^{\tilde{n}} \tilde{P}_i \tilde{B}_i(s,t) \quad (11)$$

As described in (9), each $B_i(s,t)$ can be written as a linear combination of the $\tilde{B}_j(s,t)$:

$$B_i(s,t) = \sum_{j=1}^{\tilde{n}} c_i^j \tilde{B}_j(s,t) \quad (12)$$

We require that the refined surface is equivalent to the initial surface: $P(s,t) \equiv \tilde{P}(s,t)$. This requirement is satisfied if $$\tilde{P}_j = \sum_{i=1}^{n} c_i^j P_i.$$

Thus, the element at row j and column i of $M_{1,2}$ in (10) is $c_i^j$. In this manner, it is possible to find transformation matrices $M_{i,j}$ that maps any T-spline in $S_i$ to an equivalent T-spline in $S_j$, assuming $S_i \subset S_j$.

The definition of a T-spline subspace $S_i \subset S_j$ means more than simply that the preimage of $S_j$ has all of the control points that the preimage of $S_i$ has, because sometimes it is not possible to add a given control point to an existing T-mesh without adding other control points as well. The section on local refinement presents insight into why that is, and presents our local refinement algorithm for T-splines. This, of course, will allow us to compute valid superspaces of a given T-spline space.

Local Refinement Method

T-spline local refinement means to insert one or more control points into a T-mesh without changing the shape of the T-spline surface. This procedure can also be called local knot insertion, since the addition of control points to a T-mesh is accompanied by knots inserted into neighboring basis functions.

This embodiment of the refinement algorithm has two phases: the topology phase, and the geometry phase. The topology phase identifies which (if any) control points must be inserted in addition to the ones requested. Once all the required new control points are identified, the Cartesian coordinates and weights for the refined T-mesh are computed using the linear transformation presented in the section on T-spline spaces. We now explain the topology phase of the algorithm.

An important concept in understanding this discussion is to keep in mind how in a T-spline, the basis functions and T-mesh are tightly coupled: For every control point there is a corresponding a basis function and each basis function's knot vectors are defined by Rule 1. In this invention, the basis functions are temporarily decoupled from the T-mesh. This means that during the computation method, the existence of basis functions is permitted that violate Rule 1, and control points may temporarily exist to which no basis functions are attached.

Our discussion distinguishes three possible violations that can occur during the course of the refinement algorithm:

Violation 1. A basis function is missing a knot dictated by Rule 1 for the current T-mesh.

Violation 2. A basis function has a knot that is not dictated by Rule 1 for the current T-mesh.

Violation 3. A control point has no basis function associated with it.

If no violations exist, the T-spline is valid. If violations do exist, the algorithm resolves them one by one until no further violations exist. Then a valid superspace has been found.

The topology phase of our local refinement algorithm consists of these steps:

1. Insert all desired control points into the T-mesh.
2. If any basis function is guilty of Violation 1, perform the necessary knot insertions into that basis function.
3. If any basis function is guilty of Violation 2, add an appropriate control point into the T-mesh.
4. Repeat Steps 2 and 3 until there are no more violations. Resolving all cases of Violation 1 and 2 will automatically resolve all cases of Violation 3.

Figure 14:
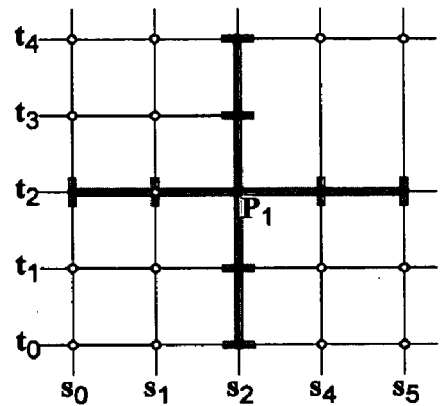
FIGS. 14a-14f illustrate a local refinement example in an embodiment of the invention.
Figure 14:
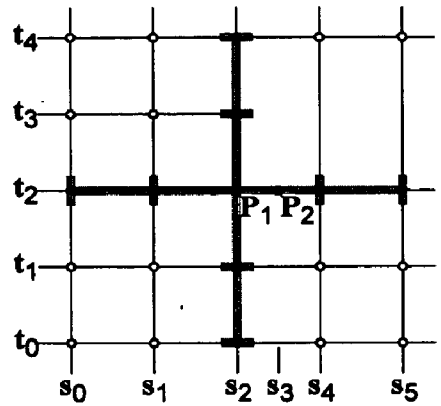
Figure 14:
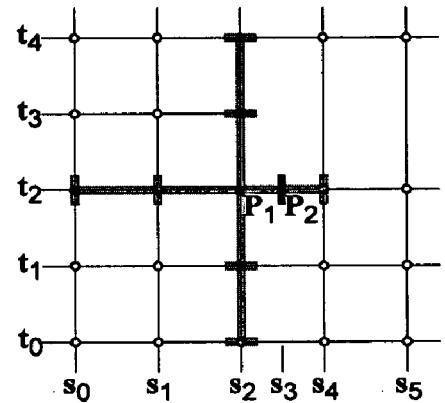
Figure 14:
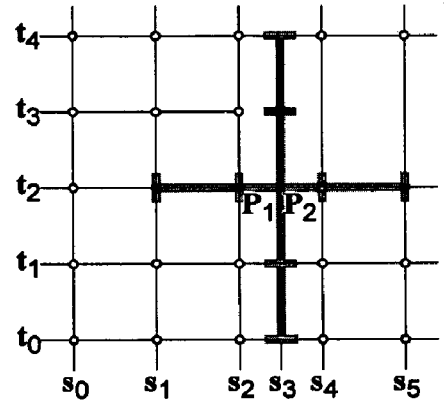
Figure 14:
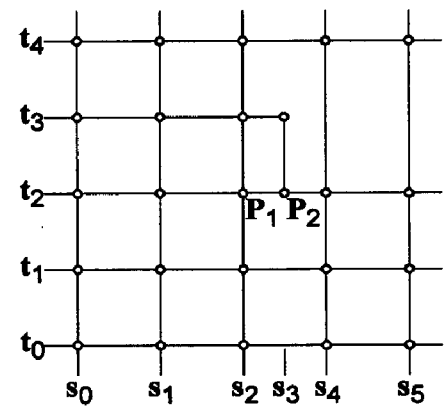
Figure 14:
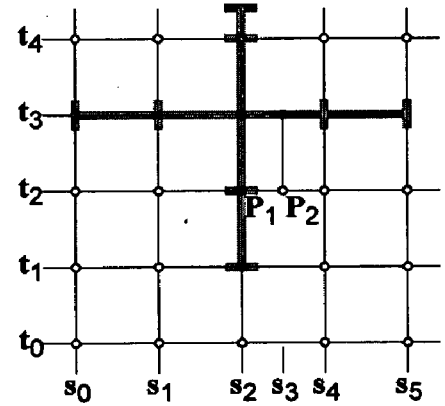

We illustrate the method with an example. FIG. 14a shows an initial T-mesh into which we wish to insert one control point, $P_2$. Because the T-mesh in FIG. 14a is valid, there are no violations. But if we simply insert $P_2$ into the T-mesh (FIG. 14b) without changing any of the basis functions, we introduce several violations. Since $P_2$ has knot coordinates $(s_3,t_2)$, four basis functions become guilty of Violation 1. Specifically, those centered at $(s_1,t_2)$, $(s_2,t_2)$, $(s_4,t_2)$, and $(s_5,t_2)$. To resolve these violations, we must insert a knot at $s_3$ into each of those basis functions, as discussed in the section on basis function refinement. The basis function centered at $(s_2,t_2)$ is $N[s_0,s_1,s_2,s_4,s_5](s)N[t_0,t_1,t_2,t_3,t_4](t)$. Inserting a knot $S=s_3$ into the s knot vector of this basis function splits it into two scaled basis functions: $(s_3-s_0)/(s_4-s_0)N[s_0,s_1,s_2,s_3,s_4](s)N[t_0,t_1,t_2,t_3,t_4](t)$ (FIG. 14c) and $(s_4-s_3)/(s_4-s_1)N[s_1,s_2,s_3,s_4,s_5](s) N[t_0,t_1,t_2,t_3,t_4](t)$ (FIG. 14d) as given in (7). The basis function $(s_3-s_0)/(s_4-s_0)N[s_0,s_1,s_2,s_3,s_4](s)N[t_0,t_1,t_2,t_3,t_4](t)$ in FIG. 14c satisfies Rule 1. Likewise, the refinements of the blending functions centered at $(s_1,t_2)$, $(s_4,t_2)$, and $(s_5,t_2)$ all satisfy Rule 1. However, the t knot vector of basis function $d_2$ $N[s_1,s_2,s_3,s_4,s_5](s)$ $N[t_0,t_1,t_2,t_3,t_4](t)$ shown in FIG. 14d is guilty of Violation 2 because the basis function's t knot vector is $[t_0,t_1,t_2,t_3,t_4]$, but Rule 1 does not call for a knot at $t_3$ problem cannot be remedied by refining this basis function, but an additional control point can be added into the T-mesh to resolve the violation.

The needed control point is $P_3$ in FIG. 14e. Inserting that control point fixes the case of Violation 2, but it creates a new case of Violation 1. As shown in FIG. 14f, the blending function centered at $(s_2,t_3)$ has an s knot vector that does not include $s_3$ as required by Rule 1. Inserting $S_3$ into that knot vector fixes the problem, and there are no further violations of Rule 1.

This method will terminate, because the basis function refinements and control point insertions must involve knot values that initially exist in the T-mesh, or that were added in Step 1. In the worst case, the algorithm would extend all partial rows of control points to cross the entire surface. In practice, the algorithm typically requires few if any additional new control points beyond the ones the user wants to insert.

Figure 15:
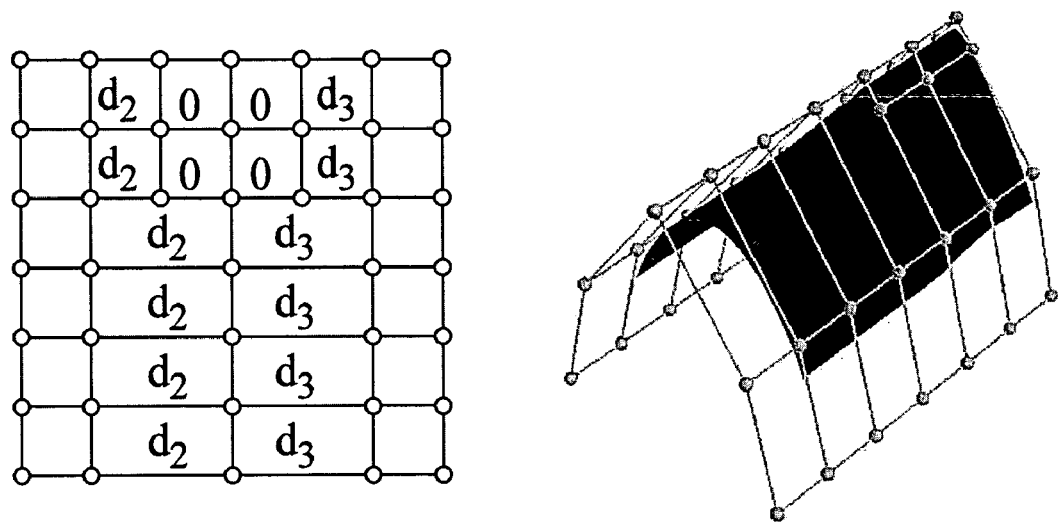
FIG. 15 illustrates the insertion of a dart in a T-mesh in an embodiment of the invention.

Local knot insertion is useful for creating features. For example, darts can be introduced into a T-spline by inserting a few adjacent rows of control points with zero knot intervals, as shown in FIG. 15. Having two adjacent knot intervals of value zero introduces a local triple knot, and the surface becomes locally $C^0$ at that knot. The shape of the crease is controlled by the placement of the inserted control points. The crease can be made less sharp by replacing the zero knot intervals in FIG. 15 with small non-zero knot intervals.

Converting a T-Spline Into a B-Spline Surface

This refinement algorithm makes it easy to convert a T-spline in $S_1$ into an equivalent B-spline surface in $S_n$ by simply computing the transformation matrix $M_{1,n}$ as discussed in the section on T-spline spaces.

A standard T-spline is one for which, if all weights $w_i=1$, then $$\sum_{i=1}^n w_i B_i(s,t) \equiv \sum_{i=1}^n B_i(s,t) \equiv 1.$$

This means that the denominator in equation (2) is identically equal to one. Hence, the basis functions provide a partition of unity and the T-spline is polynomial. Thus, an algebraic statement of necessary and sufficient conditions for a T-spline to be standard is each row of $M_{1,n}$ sums to 1.

The insertion algorithm can produce a surprising result: a T-spline for which not all $w_i=1$ but yet $$\sum_{i=1}^n w_i B_i(s,t) \equiv 1.$$

Figure 16:
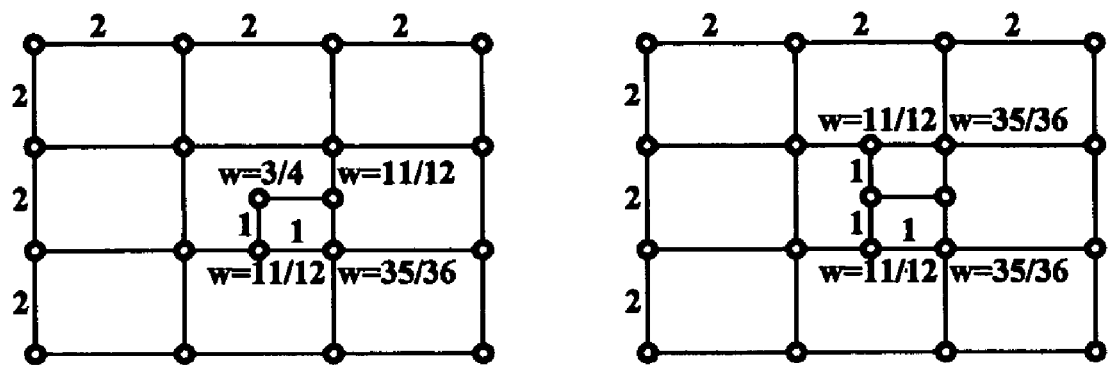
FIG. 16 illustrates semi-standard T-splines in an embodiment of the invention.

This T-spline can be called a semi-standard T-spline. FIG. 16 shows two simple examples of semi-standard T-splines. The integers (1 and 2) next to some edges are knot intervals. A semi-standard T-spline space S is one for which there exists some elements of S for which $$\sum_{i=1}^n w_i B_i(s,t) \equiv 1,$$

and not all $w_i=1$. A non-standard T-spline space is one for which no elements exist for which $$\sum_{i=1}^n w_i B_i(s,t) \equiv 1.$$

These definitions are more precise because they allow for the notion of a rational (weights not all =11) T-spline that is either standard, semi-standard, or non-standard. The distinction is made based on which type of T-spline space it belongs to.

Figure 17:
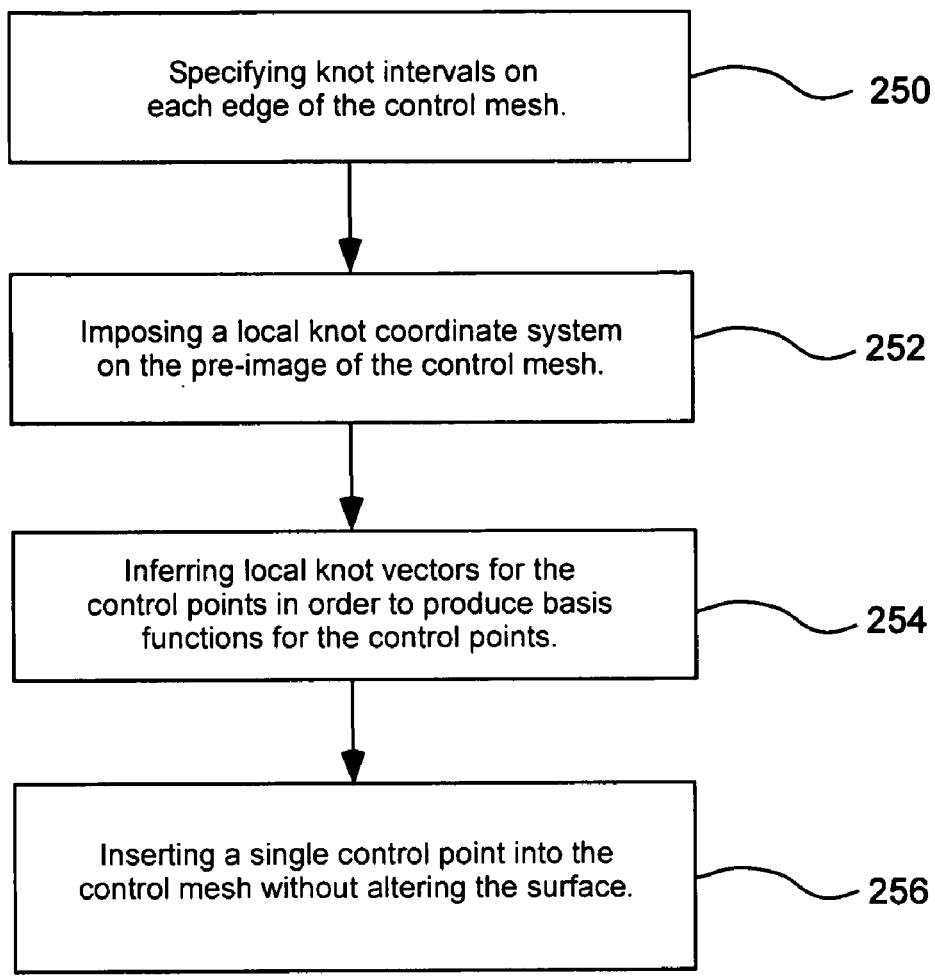
FIG. 17 is a flowchart illustrating an embodiment of a method defining bicubic spline surfaces that provides local refinement to control meshes in a computing environment.

FIG. 17 illustrates an overview of an embodiment of a method for defining bicubic spline surfaces that provides local refinement to control meshes in a computing environment. One operation that is included in the method is specifying knot intervals associated with the spline control mesh as in block 250. Another operation is imposing a local knot coordinate system based on the knot intervals as in block 252. The local knot vectors for the control points may be inferred in order to produce basis functions for the control points as in block 254. A further operation is inserting a single control point into the control mesh without altering the surface as in block 256. This insertion of the control point can permit partial rows of control points to be inserted that terminate in a T-junction which is a special control point.

Extracting Bézier Patches

It is advantageous to represent in Bézier form the patches that comprise a T-spline, because a tessellation method may then be applied with the minor modification that each T-junction must map to a triangle vertex in the tessellation to assure that cracks will not appear in the tessellation. In general, there are fewer Bézier patches in a T-spline than in the equivalent B-spline surface.

Figure 18:
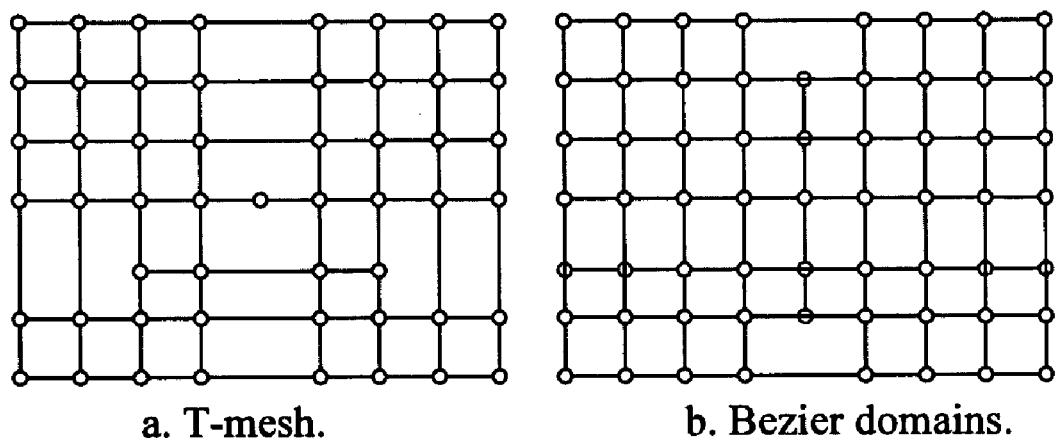
FIG. 18 illustrates Bèzier domains in a pre-image of a T-mesh in an embodiment of the present invention.

The domains of the Bézier patches that comprise a standard T-spline can be determined by extending all T-junctions by two bays, as illustrated in FIG. 18. The rectangles in FIG. 18b are Bézier domains. The reason for this can be understood by considering the knot vectors for the basis functions of each control point.

Figure 19:
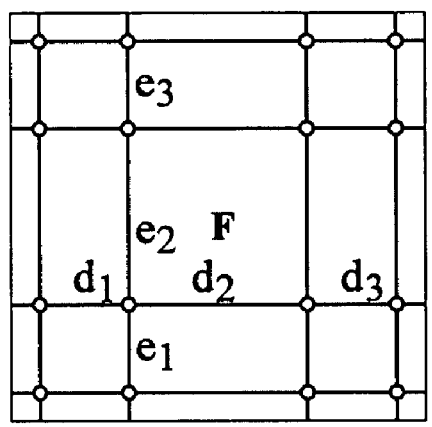
FIGS. 19a and 19b illustrate the creation of Bèzier control points using local knot insertion.
Figure 19:
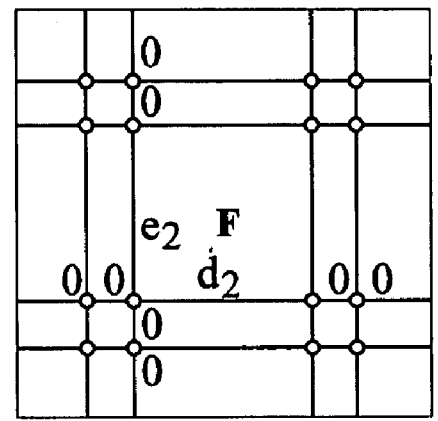

Bézier control points can be obtained by performing repeated local knot insertion. Recall that a B-spline surface can be expressed in Bézier form using multiple knots, and that a zero-knot interval implies a double knot. For the knot interval configuration in FIG. 19b, the 4×4 grid of control points surrounding F are the Bézier control points of that patch. Thus, the Bézier control points for face F in FIG. 19b can be determined by performing local knot insertion.

Merging B-Splines Into a T-Spline

Figure 20:
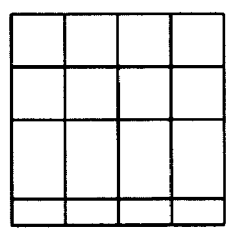
FIG. 20 illustrates the merging of two B-splines.
Figure 20:
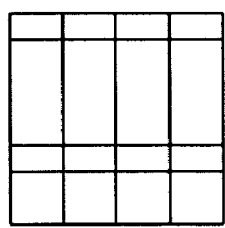
Figure 20:
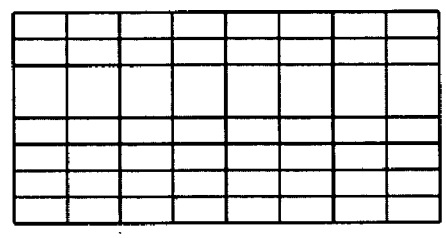

This section discusses how to merge two B-spline surfaces with different knot vectors into a single T-spline. Often in geometric modeling, portions of an object are modeled independently with different B-spline surfaces that have different knot vectors, such as the hand in FIG. 2. FIG. 20 illustrates the problem. The control grids are defined over different knot vectors. Merging them into a single B-spline requires that they have the same common knot vector, so knot insertion must first be performed before merging can proceed. As FIG. 20c illustrates, however, those required knot insertions can significantly increase the number of rows of control points. If additional surfaces are subsequently merged onto these two surfaces, the number of knot lines can multiply further.

Figure 21:
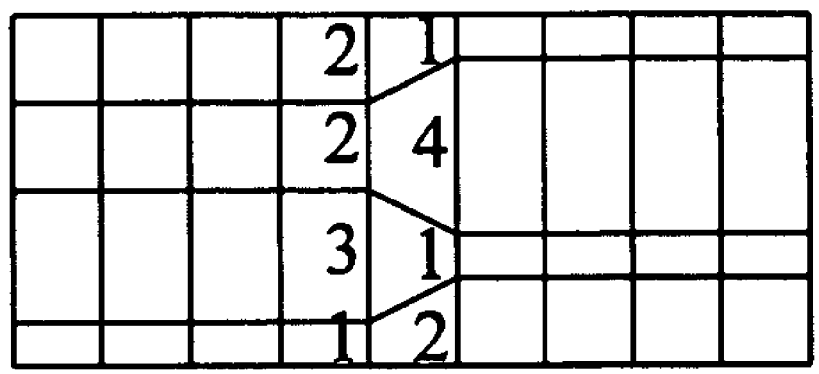
FIG. 21 illustrates merging two B-splines using cubic NURSSes and the problems created by such a merger.
Figure 21:
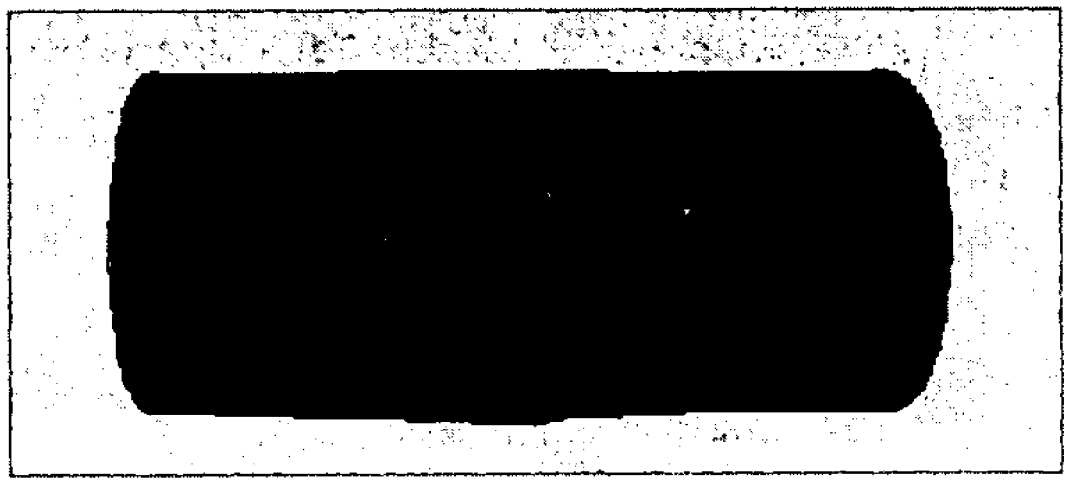

One prior solution to the problem of merging two NURBS surfaces into a single surface without a proliferation of control points was to use cubic NURSSes introduced by Thomas W. Sederberg in 1998. Since cubic NURSSes allow different knot intervals on opposing edges of a face, two NURBS control grids can be merged into a single control grid without propagating knot lines. FIG. 21 shows the result of merging two identical B-spline cylinders with different knot vectors. Unfortunately, any NURSS representation introduces an unsightly bump at the junction of the two cylinders. This failed attempt at solving the merge problem using NURSSes helped motivate the creation of T-splines.

Figure 22:
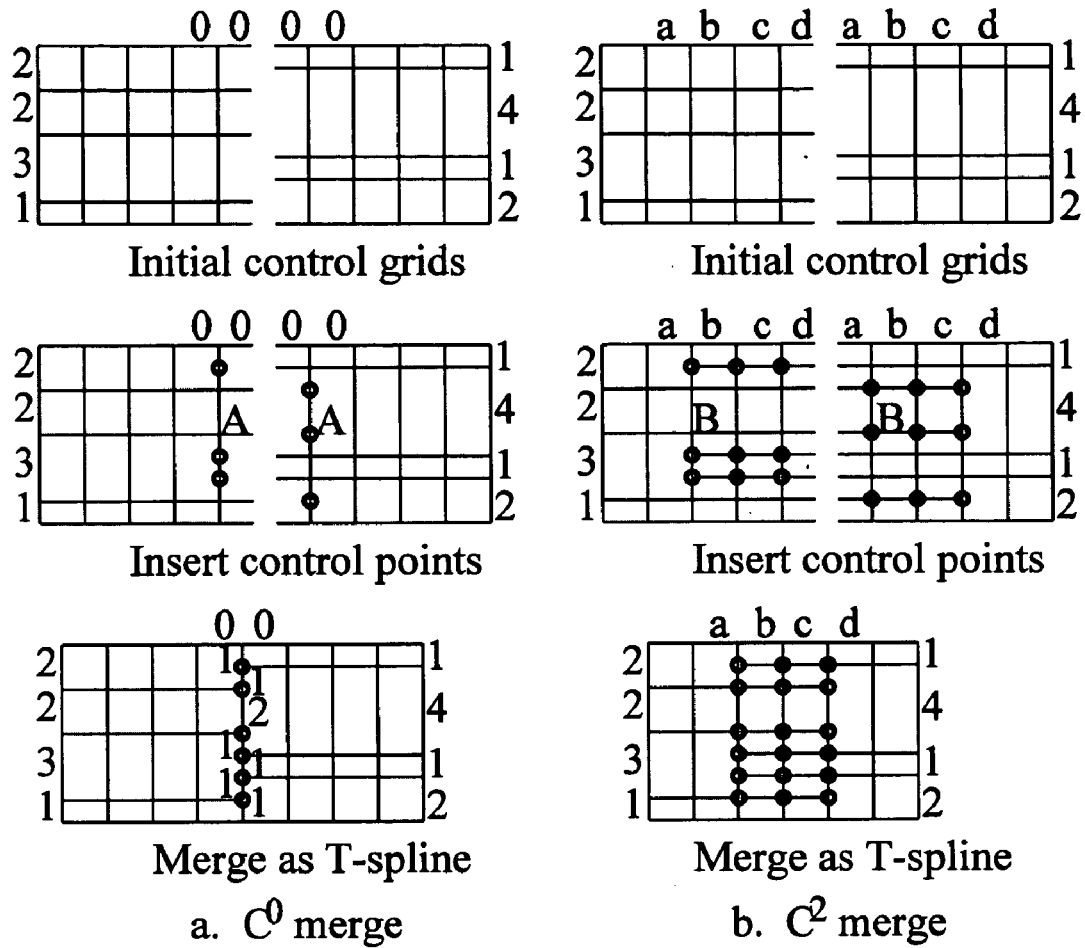
FIG. 22 depicts the merging of two B-splines using T-splines in an embodiment of the present invention.

The procedure using T-splines is illustrated in FIG. 22. For a $C^n$ merge ($n \in \{-1, 0, 1, 2\}$), n+1 columns of control points on one patch will correspond to n+1 columns of control points on the other patch. We consider first the $C^0$ merge in FIG. 22a. To begin with, each B-spline has triple knots (double knot intervals) along the shared boundary, as shown. For a $C^0$ merge, one column of control points will be shared after the merge. If the knot intervals for the two T-splines differ along that common column, control points are located along the boundary edge so that the knot intervals agree. In this example, the knot intervals on the red B-spline are 1, 3, 2, 2 and on the blue B-spline are 2, 1, 4, 1. After inserting offset control points on each control grid along the soon-to-be-joined columns as shown, the common column of control points has knot intervals 1, 1, 1, 1, 2, 1, 1.

Typically in this process, the control points that are to be merged will have slightly different Cartesian coordinates. For example, A on the red patch might differ slightly from A on the blue patch. Simply take the average of those two positions to determine the position of the merged control point.

Figure 23:
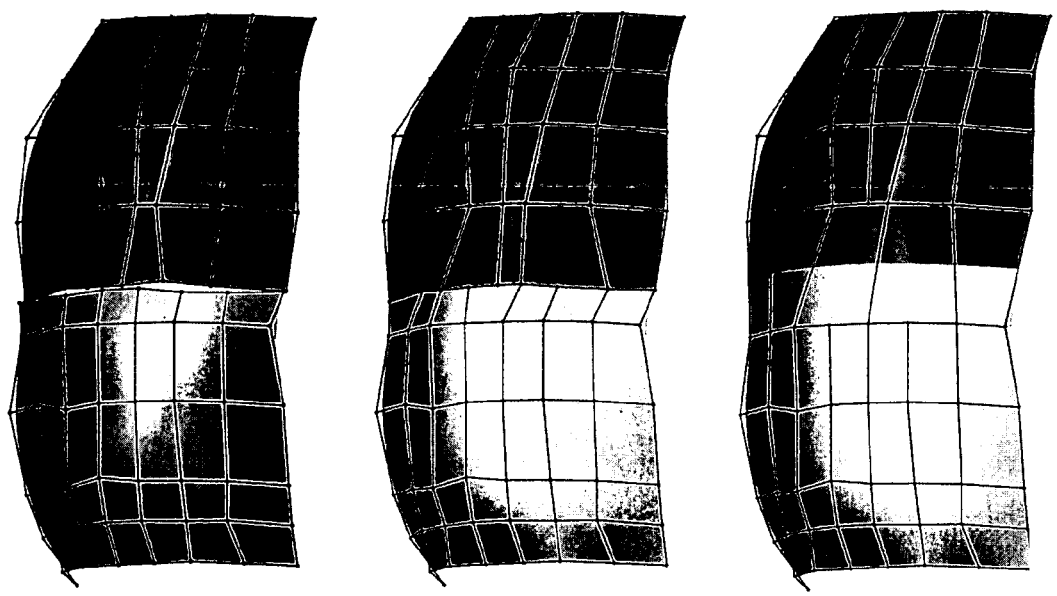
FIG. 23 depicts the results of the merging of two surfaces using B-splines, $C^0$ T-splines and $C^1$ T-splines in an embodiment of the present invention.

A $C^2$ merge is illustrated in FIG. 22b. The basic idea is the same as for a $C^0$ merge. The differences are that four knot intervals a, b, c, d must correspond between the two surfaces, as shown. Also, three columns of control points must be merged, as shown. FIG. 23 shows the results of a $C^0$ and a $C^1$ merge. FIG. 4 shows an application of this merge capability in a NURBS model of a human hand. This is a $C^0$ merge.

T-NURCCs

T-NURCCs are NURCCs (Non-Uniform Rational Catmull-Clark Surfaces) with T-junctions in their control grids and using T-spline concepts. NURCCs are generalizations of tensor product non-uniform B-spline surfaces: if there are no extraordinary points, if all faces are four-sided, and if the knot intervals on opposing edges of each face are equal, NURCCs degenerate to non-uniform B-spline surfaces. NURCCs are also generalizations of Catmull-Clark surfaces: if all knot intervals are equal, then NURCCs degenerate to a Catmull-Clark surface. Likewise, T-NURCCs are a generalization of T-splines, Catmull-Clark surfaces, and cubic NURBS surfaces.

NURCCs enforce the constraint that opposing edges of each four-sided face have the same knot interval and NURCCs have stationary refinement rules. It is also for this reason that NURCCs are capable of local refinement.

The refinement rules for NURCCs are thus identical to the refinement rules for NURSSes if we require opposing edges of each four-sided face to have the same knot interval. Those refinement rules are discussed in Thomas W. Sederberg in 1998.

We now discuss how T-junctions can be used to perform local refinement in the neighborhood of an extraordinary point. To simplify our discussion, all extraordinary points are separated by at least four faces, and all faces are four-sided. These criteria can be met by performing a few global refinement steps, if needed. Thereafter, all refinement can be performed locally. For example, any suitably large regular sub-grid of a NURCC control grid can undergo local knot insertion, as discussed previously. Also, refinement near an extraordinary point can be confined to the neighborhood of the extraordinary point.

Figure 24:
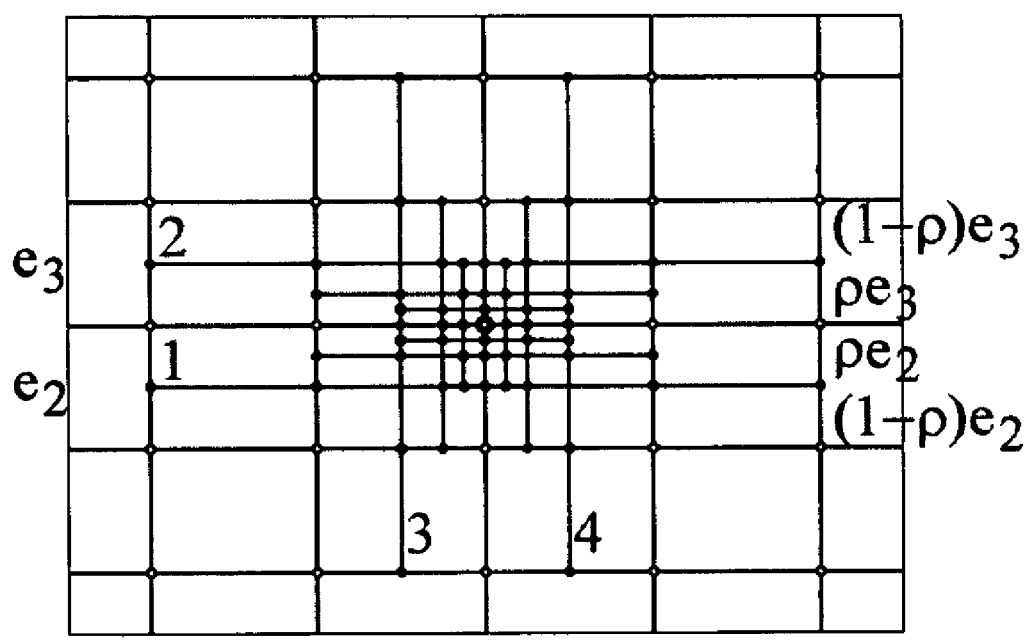
FIG. 24 illustrates local refinement using T-splines about a valence-four control point.
Figure 25:
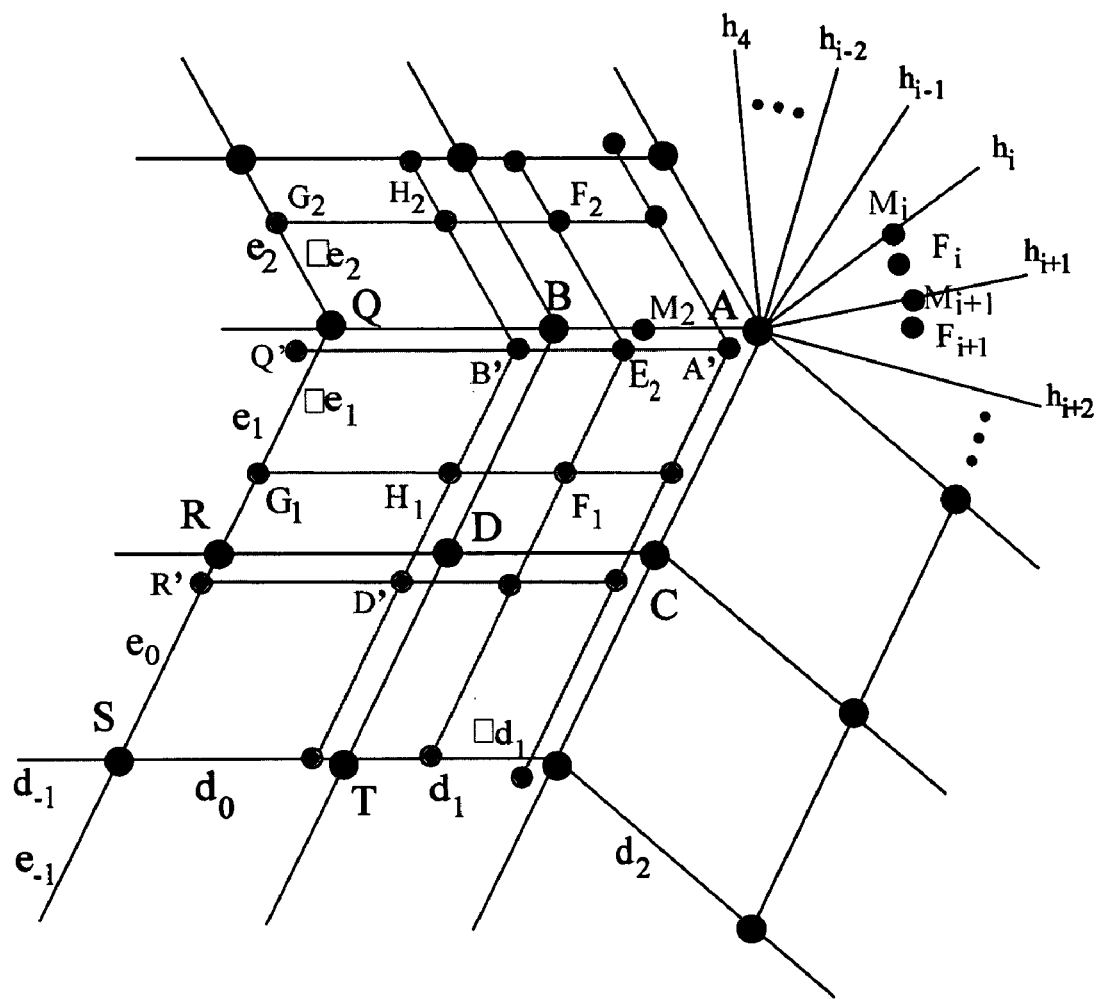
FIG. 25 illustrates local refinement using T-splines about a n-valence control point.

To explain how to perform local refinement in the neighborhood of an extraordinary point, a way to perform local knot insertion in the neighborhood of a single (valence four) vertex in a T-spline will be explained. Referring to FIG. 24, the refinement begins with the black control grid. Then, it is legal using procedures defined previously to insert all of the control points in row 1, followed by row 2, followed by column 3, followed by column 4. Then the additional control points can legally be inserted in like order, etc. What is produced is a local refinement in the immediate neighborhood of one central control point. Note that this refinement scheme can split faces at any ratio $\rho$. For a valence-4 point, changing $\rho$ does not change the limit surface since we are merely doing B-spline knot insertion, but when we adapt this scheme to extraordinary points, $\rho$ will serve as a shape parameter. FIG. 25 shows the effects of changing $\rho$.

Figure 26:
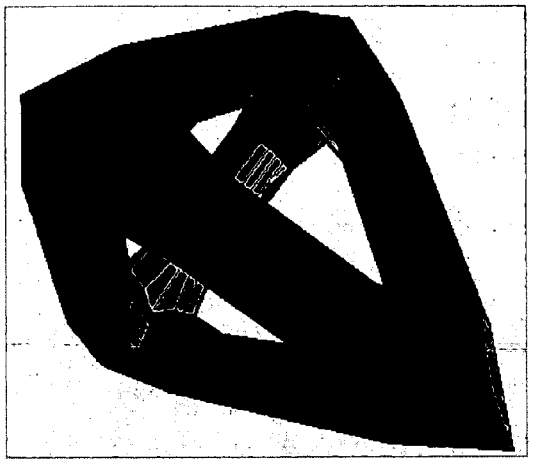
FIG. 26 illustrates a T-NURCC showing the influence of parameter ρ where the limit surface of the control grid on the top left is ρ=0.1 and the top right is ρ=0.5 and the bottom right is ρ=0.9.
Figure 26:
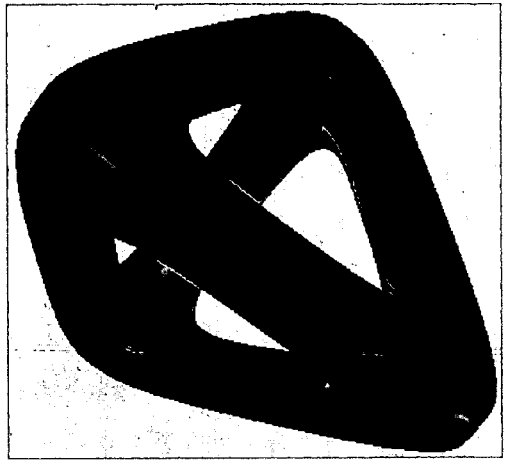
Figure 26:
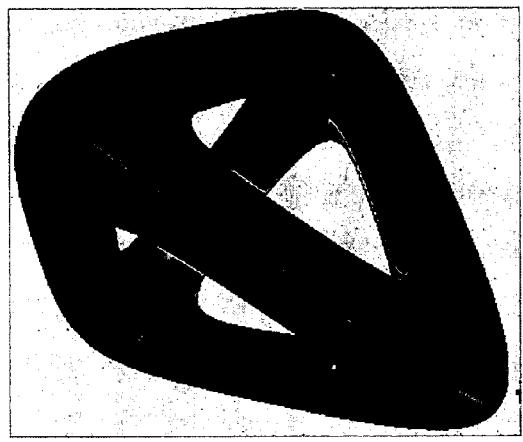
Figure 26:
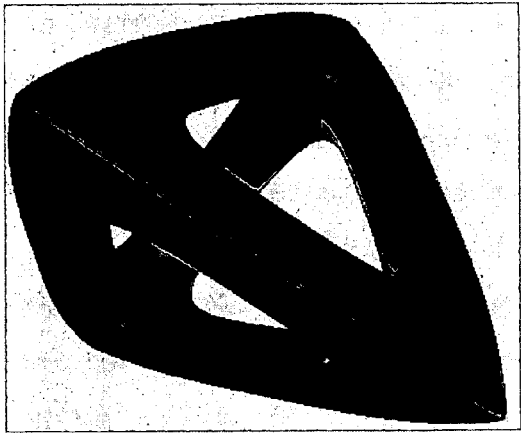

We now present the local refinement rules for T-NURCCs at an isolated extraordinary point. Referring to FIG. 26, knot interval $d_1$ is split into knot intervals $d_1$ is split into knot intervals $\rho\ d_1$ and $(1-\rho)d_1$; likewise for the other knot intervals adjacent to the extraordinary point. If $\rho=\frac{1}{2}$ and if all the initial knot intervals are equal, the limit surface obtained using this local refinement is equivalent to a Catmull-Clark surface.

Lower-case letters refer to knot intervals and upper-case letters to points. Vertices A, B, C, D, Q, R, S, T are the initial control points, prior to refinement. After refinement, these vertex points are replaced by new vertex points denoted with primes: A', B', C', D', Q', R'.

$$F_1 = \frac{[e_0 + (1-\rho)e_1][(d_0 + (1-\rho)d_1)A + (\rho d_1 + d_2)B]}{(d_0 + d_1 + d_2)(e_0 + e_1 + e_2)} + \frac{[\rho e_1 + e_2][(d_0 + (1-\rho)d_1)C + (\rho d_1 + d_2)D]}{(d_0 + d_1 + d_2)(e_0 + e_1 + e_2)}$$

There are three types of edge points: E, H, and G.

$$E_2 = \rho M_2 + (1-\rho)\frac{e_2 F_1 + e_1 F_2}{e_1 + e_2}$$

where $$M_2 = \frac{2\rho d_1 + d_2 + h_4}{2(d_0 + d_1) + d_2 + h_4}B + \frac{2d_0 + 2(1-\rho)d_1}{2(d_0 + d_1) + d_2 + h_4}A.$$

$$\text{Edge point } H_1 = \frac{\rho d_1[(\rho e_1 + e_2)R + (e_0 + (1-\rho)e_1)Q]}{(d_{-1} + d_0 + d_1)(e_0 + e_1 + e_2)} + \frac{[d_{-1} + d_0 + (1-\rho)d_1][(\rho e_1 + e_2)D + (e_0 + (1-\rho)e_1)B]}{(d_{-1} + d_0 + d_1)(e_0 + e_1 + e_2)}$$

$$\text{Edge point } G_1 = \frac{\rho e_1 + e_2}{e_0 + e_1 + e_2}R + \frac{e_0 + (1-\rho)e_1}{e_0 + e_1 + e_2}Q.$$

There are five different types of vertex points: those that replace A, B, Q, D, and R. We will denote the new vertex point at A by A', etc.

$$A' = \rho^2 A + 2\rho(1-\rho)\frac{\sum_{i=0}^{n-1} m_i M_i}{\sum_{i=0}^{n-1} m_i} + (1-\rho)^2 \cdot \frac{\sum_{i=0}^{n-1} f_i F_i}{\sum_{i=0}^{n-1} f_i}$$

where n is the valence, $m_i=(h_{i-1}+h_{i+1})(h_{i-2}+h_{i+2})/2$, and $f_i=h_{i-1}h_{i+2}$.

$$B' = (1-\rho)\frac{e_1 H_2 + e_2 H_1}{e_1 + e_2} + \rho\left[\frac{\rho d_1}{d_{-1} + d_0 + d_1}Q + \frac{d_{-1} + d_0 + (1-\rho)d_1}{d_{-1} + d_0 + d_1}B\right]$$

$$Q' = \rho Q + (1-\rho)\frac{e_1 G_2 + e_2 G_1}{e_1 + e_2}$$

$$D' = \frac{\rho d_1 \rho e_1 S + [d_{-1} + d_0 + (1-\rho)d_1]\rho e_1 T}{(d_{-1} + d_0 + d_1)(e_{-1} + e_0 + e_1)} + \frac{[\rho d_1 R + (d_{-1} + d_0 + (1-\rho)d_1)D][e_{-1} + e_0 + (1-\rho)e_1]}{(d_{-1} + d_0 + d_1)(e_{-1} + e_0 + e_1)}$$

$$R' = \frac{\rho e_1}{e_{-1} + e_0 + e_1}S + \frac{e_{-1} + e_0 + (1-\rho)e_1}{e_{-1} + e_0 + e_1}R.$$

Local refinement at such an extraordinary point is illustrated in FIG. 6, which shows a T-NURCC that has undergone four steps of local refinement. The yellow dots highlight four T-junctions. Note that this locally-refined mesh has two orders of magnitude fewer faces than it would have using global Catmull-Clark refinement.

This discussion has assumed that extraordinary vertices are separated by at least four faces, and this can be accomplished by performing a few preliminary global refinement steps. It is possible to derive local refinement rules that would not require such initial global refinement steps, but there are additional special cases to consider.

Away from extraordinary points, NURCCs are $C^2$, except that zero knot intervals will lower the continuity. At extraordinary points where all edges have the same knot interval value, an eigenanalysis for the valence 3 case shows $\lambda_1$, $=1>\lambda_2=\lambda_3>\lambda_4> \ldots$ where, for example, $$\lambda_2 = \lambda_3 = \frac{1+2\rho+\rho^2 + \sqrt{(\rho^2+6\rho+1)(\rho-1)^2}}{4}\rho.$$

This gives analytic proof that for the valence three case, the surface is $G^1$ for any legal value of $\rho(0<\rho<1)$. A similar result can be obtained for valence five. For higher valence, the symbolic algebra expressions get unwieldy, but a sampling of specific values of $\rho$ has not revealed any case where the $G^1$ condition is not satisfied. If the knot intervals for edges neighboring on extraordinary point are not equal, then the empirical evidence suggests $G^1$.

T-splines and T-NURCCs permit true local refinement: control points can be added without altering the shape of the surface, and (unless there are knot intervals with a value of zero) the new control points can be moved and the surface will remain $C^2$. Since T-NURCCs generalize NURBS and Catmull-Clark surfaces, a modeling program based on T-NURCCs can handle any NURBS or Catmull-Clark model as a special case.

The present invention has been illustrated using bi-cubic B-spline surfaces. However, the present invention can also be implemented using B-spline surfaces of any degree. The concepts explained in this invention would enable one skilled in the art to derive T-splines of any degree, and this is a straightforward exercise. One difference between even-degree T-splines and odd-degree T-splines is that for even degree T-splines, the knot intervals are associated with control points and for odd-degree, the knot intervals are associated with edges of the control grid.

An additional use of the present invention is to use T-NURCCS to provide a seamless representation for the intersection of two T-NURCCs, or of any special case of T-NURCCS, such as bicubic NURBS surfaces or T-splines.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

What is claimed:

1. A method for defining a bi-cubic spline surface in a computing environment, comprising the steps of:
    creating a control mesh with a substantially rectangular structure and containing T-junctions in both parameter directions and in any proximity in the control mesh;
    inferring from the control mesh the tensor product B-spline basis functions for each control point including T-junctions in both parameter directions; and
    computing the surface suitable for use in rendering an image viewable by an end user based on the inferred basis functions and the control mesh.

2. A method as in claim 1, further comprising the step of determining the basis function for each control point using one non-hierarchical set of rules.

3. A method as in claim 1, wherein the bi-cubic spline surface is a locally refinable tensor product spline surface of any degree in a computing environment.

4. A method for locally refining a control mesh of a bi-cubic spline surface in a computing environment, comprising the steps of:
    inserting a control point into the control mesh to form a T-junction in any proximity to other T-junctions existing in both parameter directions in the control mesh;
    computing the Cartesian coordinates of the control point and of the neighboring control points using inferred basis functions such that the bi-cubic spline surface is not geometrically altered and suitable for use in rendering an image viewable by an end user.

5. A method as in claim 4, wherein the step of computing the Cartesian coordinates of the control points further comprises the steps of:
    splitting basis functions which have fewer knots than are called for by the control mesh; and
    adding control points to the control mesh in locations where basis functions have more knots than are called for by the control mesh.

6. A method as in claim 4, further comprising the step of creating a sharpness feature in the surface by inserting one or more adjacent partial rows of control points with zero knot intervals thereby creating a sharp crease.

7. A method as in claim 4, further comprising the step of creating a sharpness feature in the surface by inserting one or more adjacent partial rows of control points with small knot intervals thereby creating a less sharp crease.

8. A method as in claim 4 further comprising the step of
    providing two surfaces having control meshes that are allowed to contain T-junction in at least one parameter direction, that are desired to be merged into a single surface;
    positioning the two surfaces with common edges that are in close proximity;
    performing local refinement on the control meshes of the two surfaces using the T-junction and adjustment of knot intervals such that a sequence of knot intervals agree along a common boundary edge of the two surfaces; and
    joining the control points of the two surfaces along the common boundary.

9. A method for defining bicubic spline surfaces that provides local refinement to control meshes using T-junction in both parameter direction and in any proximity with respect to the other T-junctions, in a computing environment, comprising the steps of:
    specifying knot intervals associated with the control mesh containing T-junction in both parameter directions simultaneously;
    imposing a local knot coordinate system based on the knot intervals;
    inferring local knot vectors for control points in order to produce basis functions for the control points; and
    inserting a single control point into the control mesh to form a T-junction at any distance and configuration with respect to other T-junctions without altering the bicubic spline surface, the bicubic spline surface being suitable for use in rendering an image viewable by an end user.

10. A method as in claim 9, wherein the step of imposing a local knot coordinate system further comprises the step of assigning local knot coordinates $(s_i, t_i)$ to the pre-image of each control point $P_i$.

11. A method for subdividing a bi-cubic spline control mesh in order to provide local refinements to control meshes of arbitrary topology in a computing system, comprising the steps of:
    imposing local knot coordinate systems on the bi-cubic spline mesh of arbitrary topology;
    specifying knot intervals for edges of the bi-cubic spline control mesh;
    inserting a T-junction into the bi-cubic spline control mesh to form the T-junction in any proximity to other T-junctions existing in both parameter direction in the control mesh;
    inferring knot vectors for the T-junction; and
    defining basis functions for the T-junction using the knot vectors, the bi-cubic spline mesh being suitable for use in rendering an image viewable by an end user.

12. A method as in claim 11, wherein the step of inserting a T-junction further comprises the step of requiring a sum of knot intervals on opposing edges of a face in the cubic spline mesh to be equal.

13. A method as in claim 11, wherein the step of inserting a T-junction further comprises the step of requiring a T-junction on one edge of a face to be connected to a T-junction on an opposing edge of the face when the sum of the knot intervals on opposing edges of a face in the cubic spline mesh are equal.

14. A method as in claim 11, further comprising the step of creating a sharpness feature in the spline mesh by inserting a plurality of adjacent rows of control points with zero knot intervals.

15. A method as in claim 14, further comprising the step of controlling the sharpness feature by placement of the inserted control points and adjusting the knot intervals.

16. A method for merging at least two B-spline surfaces with unaligned knot vectors into a single T-spline, comprising the steps of:
    identifying a first B-spline control mesh and second B-spline control mesh;
    identifying locations in the first B-spline control mesh for additional control points on an edge configured to align with a knot vector in the second B-spline control mesh which will intersect the edge;
    inserting offset T-junction control points at each identified location in the first control mesh to form T-junction control points in any proximity to other T-junctions existing in both parameter directions with respect to the other T-junctions in the control mesh; and
    joining the control points of the first B-spline control mesh with the corresponding knot vectors from the second mesh in order to join the two B-splines and create a T-spline suitable for use in rendering an image viewable by an end user.

17. A method as in claim 16, further comprising the steps of
    identifying locations in the second B-spline control mesh for additional controls points on an edge configured to align with a knot vector in the first B-spline control mesh which will intersect the edge;
    inserting offset control points at each identified location in the second B-spline control mesh;
    joining the control points of the second B-spline control mesh with the corresponding knot vectors from the first mesh in order to join the two B-splines and create a T-spline.

18. A method as in claim 16, wherein the step of inserting offset control points at each identified location, further comprises the step of inserting triple knot intervals along the shared boundary in order to provide a $C^2$ merge.

* * * * *

UNITED STATES PATENT AND TRADEMARK OFFICE
CERTIFICATE OF CORRECTION

PATENT NO. : 7,274,364 B2
APPLICATION NO. : 10/811057
DATED : September 25, 2007
INVENTOR(S) : Thomas W. Sederberg It is certified that error appears in the above-identified patent and that said Letters Patent is hereby corrected as shown below:

Column 1; line 7 add:

GOVERNMENT RIGHTS

This invention was made with government support under CCR-9912411 awarded by the National Science Foundation. The government has certain rights in the invention.

Signed and Sealed this

Sixth Day of October, 2009

David J. Kappos
*Director of the United States Patent and Trademark Office*